(12) United States Patent
Kim et al.

(10) Patent No.: US 12,058,887 B2
(45) Date of Patent: Aug. 6, 2024

(54) DISPLAY DEVICE

(71) Applicant: Samsung Display Co., Ltd., Yongin-si (KR)

(72) Inventors: Woongsik Kim, Hwaseong-si (KR); Jin-Su Byun, Seoul (KR); Donghwan Bae, Seoul (KR); Sanghyun Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/354,261

(22) Filed: Jul. 18, 2023

(65) Prior Publication Data

US 2023/0363200 A1    Nov. 9, 2023

Related U.S. Application Data

(63) Continuation of application No. 17/461,023, filed on Aug. 30, 2021, now Pat. No. 11,751,430.

(30) Foreign Application Priority Data

Dec. 30, 2020   (KR) ........................ 10-2020-0188156

(51) Int. Cl.
*H10K 59/35*   (2023.01)
*G06F 3/041*   (2006.01)
*G06F 3/044*   (2006.01)
*H10K 50/844*  (2023.01)
*H10K 50/86*   (2023.01)
*H10K 59/40*   (2023.01)

(52) U.S. Cl.
CPC ......... *H10K 50/865* (2023.02); *G06F 3/0412* (2013.01); *G06F 3/0446* (2019.05);
(Continued)

(58) Field of Classification Search
CPC ............ H01L 51/5275; H01L 27/3216; H01L 27/3218; H01L 51/5284; H01L 27/323;
(Continued)

(56) References Cited

U.S. PATENT DOCUMENTS 9,318,726  B2   4/2016  Choi et al.
10,224,377 B2   3/2019  Park et al.
(Continued)

FOREIGN PATENT DOCUMENTS

KR   10-2018-0005323    1/2018
KR   10-2019-0004863    1/2019
(Continued)

*Primary Examiner* — Deeprose Subedi
(74) *Attorney, Agent, or Firm* — KILE PARK REED & HOUTTEMAN PLLC

(57) ABSTRACT

A display device includes a display panel including a first area including a peripheral region and an emission region of a pixel of a first group; and a second area including a peripheral region and an emission region of a pixel of a second group; at least one insulating layer disposed on the display panel and overlapping the second area; an organic layer disposed on the at least one insulating layer and overlapping the second area; and a light blocking pattern disposed on the organic layer and overlapping the second area. A first opening corresponding to the emission region of the pixel of the second group is formed in the organic layer, and a first light blocking opening corresponding to the first opening is formed in the light blocking pattern.

22 Claims, 17 Drawing Sheets

(52) U.S. Cl.
CPC ......... *H10K 50/844* (2023.02); *H10K 59/353* (2023.02); *H10K 59/40* (2023.02); *G06F 2203/04111* (2013.01); *G06F 2203/04112* (2013.01)

(58) Field of Classification Search
CPC ..... H01L 51/5253; H01L 27/322; G06F 1/16; G06F 3/0446; G06F 3/041; G06F 3/0412; G06F 2203/04112; G06F 2203/04111
See application file for complete search history.

(56) References Cited

U.S. PATENT DOCUMENTS

| | | | |
|---|---|---|---|
| 10,388,913 B2 | 8/2019 | Jung et al. | |
| 10,693,091 B2 | 6/2020 | Kim et al. | |
| 10,707,447 B2 | 7/2020 | Kim et al. | |
| 10,777,621 B2 | 9/2020 | Lee et al. | |
| 2016/0071911 A1 | 3/2016 | Lee | |
| 2017/0358780 A1 | 12/2017 | Li et al. | |
| 2018/0095584 A1* | 4/2018 | Lee | H10K 50/824 |
| 2019/0013495 A1 | 1/2019 | Kim et al. | |
| 2022/0122535 A1 | 4/2022 | Jung et al. | |

FOREIGN PATENT DOCUMENTS

| | | |
|---|---|---|
| KR | 10-2019-0045964 | 5/2019 |
| KR | 10-2019-0078723 | 7/2019 |
| KR | 10-2019-0087689 | 7/2019 |
| KR | 10-2020-0071189 | 6/2020 |
| KR | 10-2020-0085968 | 7/2020 |
| KR | 10-2189819 | 12/2020 |
| KR | 10-2433274 | 8/2022 |

* cited by examiner

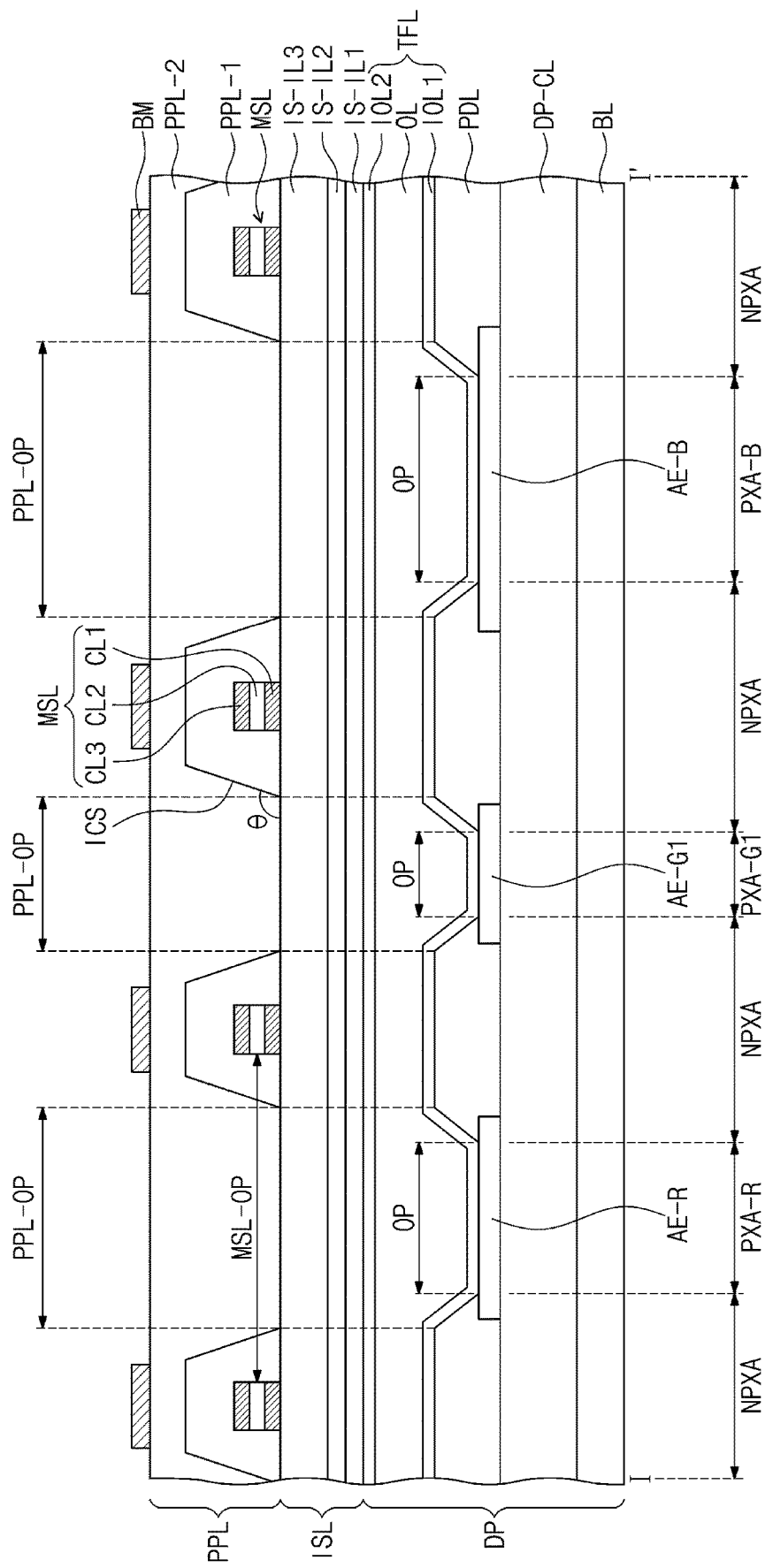

DISPLAY DEVICE

CROSS-REFERENCE TO RELATED APPLICATION(S)

This is a continuation application of U.S. patent application Ser. No. 17/461,023, filed Aug. 30, 2021 (now pending), the disclosure of which is incorporated herein by reference in its entirety. U.S. patent application Ser. No. 17/461,023 claims priority to and the benefit of Korean Patent Application No. 10-2020-0188156 under 35 U.S.C. § 119, filed on Dec. 30, 2020, in the Korean Intellectual Property Office (KIPO), the entire contents of which are incorporated herein by reference.

BACKGROUND

Embodiments of the disclosure described herein relate to a display device, and more specifically, relate to a display device capable of operating in two modes.

Electronic devices such as smart phones, tablets, notebook computers, car navigation systems and smart televisions have been developed. These electronic devices include a display device to provide information.

A user requests an image of a quality suitable for usage situation. For example, outside a building affected by natural light, the user demands a brighter image. For example, in an electronic device in which personal information is viewed, the user requests an image with a narrow viewing angle.

SUMMARY

Embodiments of the disclosure provide a display device capable of providing an image that meets needs of a user.

According to an embodiment of the disclosure, a display device may include a display panel, at least one insulating layer, an organic layer, and a light blocking pattern. The display panel may include a first area including a peripheral region and an emission region of a pixel of a first group, and a second area including a peripheral region and an emission region of a pixel of a second group. The at least one insulating layer may be disposed on the display panel and overlaps the second area. The organic layer may be disposed on the at least one insulating layer and overlaps the second area. The light blocking pattern may be disposed on the organic layer and overlaps the second area. A first opening corresponding to the emission region of the pixel of the second group may be defined in the organic layer. A first light blocking opening corresponding to the first opening may be formed in the light blocking pattern.

According to and embodiment, a first stacked structure may be formed on the display panel and overlap the first area, and a second stacked structure may be formed on the display panel and overlap the second area, and a cross sectional stacked structure of the first stacked structure and a cross sectional stacked structure of the second stacked structure may be different from each other.

According to and embodiment, the display device may further include an organic pattern disposed on the display panel, overlapping the first area, and not overlapping the second area.

According to and embodiment, the at least one insulating layer may overlap the first area, the organic layer may overlap the first area, and the light blocking pattern may not overlap the first area.

According to and embodiment, the display panel may include a thin encapsulation layer overlapping light emitting elements of the pixel of the first group and the pixel of the second group, and the thin encapsulation layer may include a first encapsulation inorganic layer, an organic layer disposed on the first encapsulation inorganic layer, and a second encapsulation inorganic layer disposed on the organic layer.

According to and embodiment, the display device may further include at least one inorganic layer disposed between the second encapsulation inorganic layer and the organic pattern.

According to and embodiment, a thickness of the organic pattern may be about 30,000 Å or less.

According to and embodiment, the at least one insulating layer may include a first inorganic layer, a second inorganic layer disposed on the first inorganic layer, and an organic layer disposed on the second inorganic layer. The organic pattern may be disposed between the first inorganic layer and the second inorganic layer.

According to and embodiment, the display panel may deactivate the pixel of the first group and may activate the pixel of the second group in a first operation mode, and the display panel may activate the pixel of the first group and the pixel of the second group in a second operation mode.

According to and embodiment, the pixel of the first group may include a first color pixel, a second color pixel, and a third color pixel that generate different lights from one another, and the pixel of the second group may include a first color pixel, a second color pixel, and a third color pixel that generate different lights from one another.

According to and embodiment, each of the first area and the second area may include a plurality of unit regions, the first color pixel, the second color pixel, and the third color pixel may be disposed in each of the plurality of unit regions, and the first color pixel, the second color pixel, and the third color pixel in the first group and the first color pixel, the second color pixel, and the third color pixel in the second group may have a same arrangement.

According to and embodiment, the display device may further include a planarization layer overlapping the first area and the second area and filling the first opening.

According to and embodiment, a refractive index of the planarization layer may be greater than a refractive index of the organic layer.

According to and embodiment, the planarization layer may overlap the light blocking pattern.

According to and embodiment, the organic layer may include an inclined surface defining the first opening, and the inclined surface and an upper surface of the at least one insulating layer exposed to the first opening may meet at an obtuse angle.

According to and embodiment, the display device may further include an input sensor to detect an external input. The input sensor may include a conductive mesh line overlapping the peripheral region and defining a sensor opening corresponding to the emission region, and the conductive mesh line may be disposed on the at least one insulating layer and overlap by the organic layer.

According to and embodiment, the at least one insulating layer may include a first inorganic layer and a second inorganic layer disposed on the first inorganic layer, the conductive mesh line may include a first sensing electrode and sensing patterns insulated from the first sensing electrode, and the input sensor may include a bridge pattern which electrically connects the sensing patterns and overlaps the first sensing electrode. The bridge pattern may be disposed between the first inorganic layer and the second inorganic layer.

According to and embodiment, the organic layer may include a second opening corresponding to the emission region of the pixel of the first group, and a depth of the second opening may be smaller than a depth of the first opening.

According to an embodiment, a display device may include a display panel including a first area including emission regions of a first group, and a second area including emission regions of a second group, an input sensor disposed on the display panel, and an optical control layer disposed on the input sensor. The input sensor may include at least one insulating layer on the display panel, an organic pattern overlapping the first area and not overlapping the second area, a conductive mesh line disposed on the at least one insulating layer and the organic pattern and defining a plurality of sensor openings corresponding to the emission region of the first group and the emission region of the second group, and an organic layer overlapping the conductive mesh line and including openings corresponding to the emission regions of the second group. The optical control layer may include a light blocking pattern disposed on the organic layer, not overlapping the first area, and overlapping the second area, the light blocking pattern including light blocking openings corresponding to the openings of the organic layer, and a planarization layer overlapping the first area and second area, filling the openings, and having a higher refractive index than a refractive index of the organic layer.

According to an embodiment, a pixel of the first group and a pixel of the second group may have a same pixel arrangement.

According to an embodiment, the organic layer may include an inclined surface defining a corresponding first opening among the openings, and the inclined surface and an upper surface of the at least one insulating layer exposed to the corresponding first opening among the openings may meet at an obtuse angle.

According to an embodiment, a thickness of the organic pattern may be about 30,000 Å or less.

According to an embodiment, a display device may include a display panel including a first area in which a pixel of a first group deactivated in a first operation mode and activated in a second operation mode is arranged, and a second area in which a pixel of a second group activated in the first operation mode and the second operation mode is arranged, an organic pattern disposed on the display panel, overlapping a light emitting element of the pixel of the first group, and not overlapping a light emitting element of the pixel of the second group, and an organic layer disposed on the organic pattern, the organic layer including an opening corresponding to the light emitting element of the pixel of the second group.

BRIEF DESCRIPTION OF THE DRAWINGS

The above and other objects and features of the disclosure will become apparent by describing in detail embodiments thereof with reference to the accompanying drawings.

FIG. 9 is a schematic cross-sectional view taken along line II-IT of FIG. 4B of a display device according to an embodiment of the disclosure.

DETAILED DESCRIPTION OF THE EMBODIMENTS

Figure 1A:
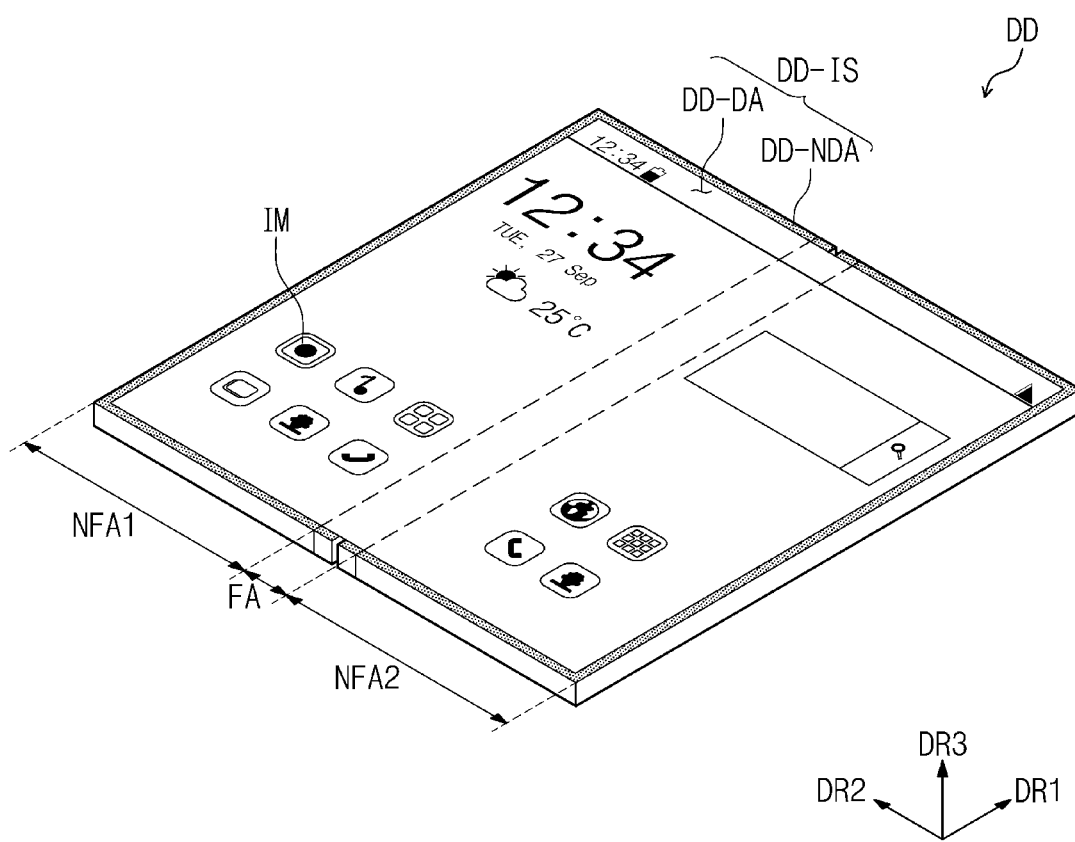
FIGS. 1A to 1C are schematic perspective views of a display device according to an embodiment of the disclosure.

In the specification, when one component (or area, layer, part, or the like) is referred to as being "on," "connected to," or "coupled to" another component, it should be understood that the former may be directly on, connected to, or coupled to the latter, and also may be on, connected to, or coupled to the latter via a third intervening component.

Like reference numerals refer to like components. Also, in drawings, the thickness, ratio, and dimension of components may be exaggerated for effectiveness of description of technical contents. The term "and/or" includes one or more combinations of the associated listed items.

The terms "first," "second," and the like are used to describe various components, but the components are not limited by the terms. The terms are used only to differentiate one component from another component. For example, a first component may be named as a second component, and vice versa, without departing from the spirit or scope of the disclosure. A singular form, unless otherwise stated, includes a plural form.

Also, the terms "under," "beneath," "on," and "above" are used to describe a relationship between components illustrated in a drawing. The terms are relative and are described with reference to a direction indicated in the drawing.

It will be understood that the terms "include," "comprise," "have," etc. specify the presence of features, numbers, steps, operations, elements, or components, described in the specification, or a combination thereof, not precluding the presence or additional possibility of one or more other features, numbers, steps, operations, elements, or components or a combination thereof.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described with reference to the drawings.

Figure 1B:
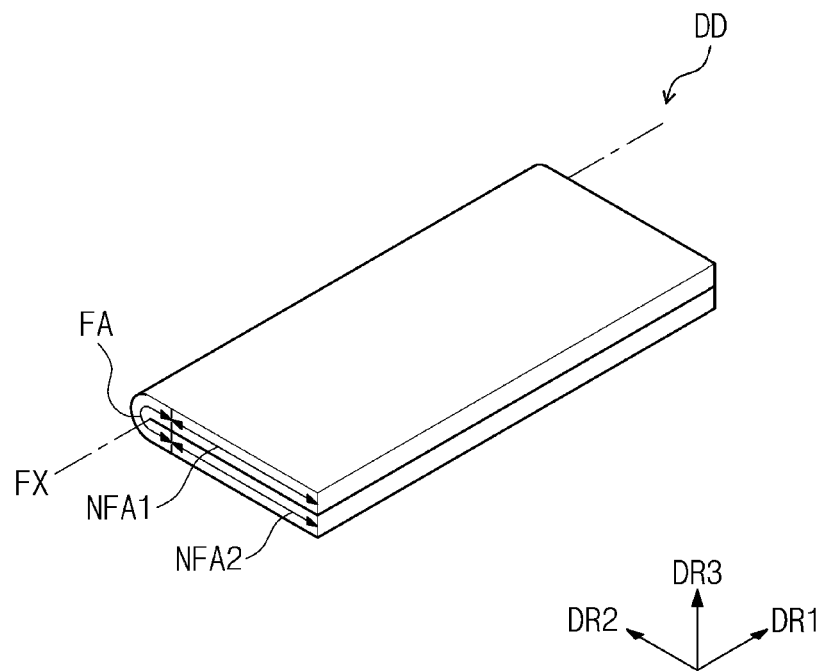
Figure 1C:
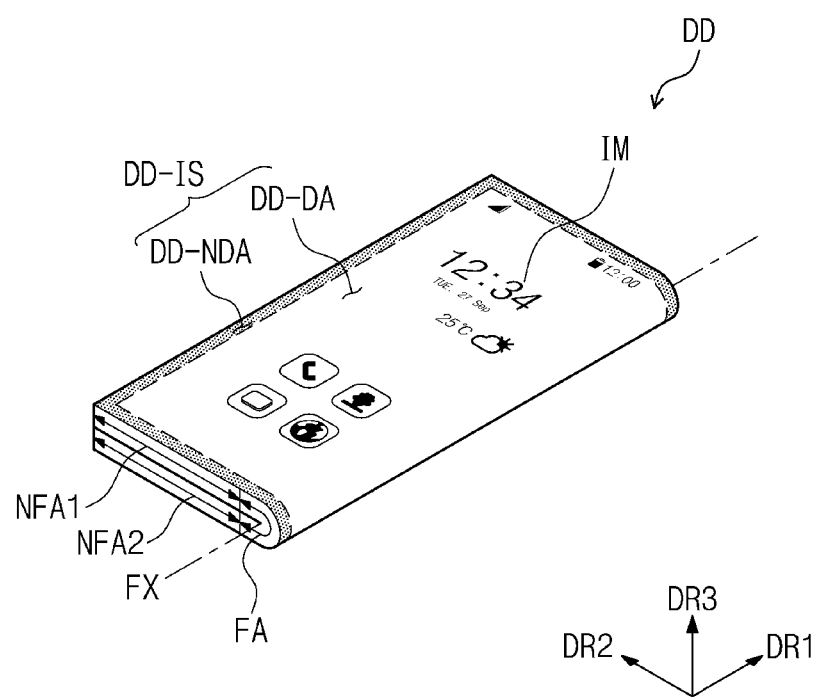

FIGS. 1A to 1C are schematic perspective views of a display device DD according to an embodiment.

As illustrated in FIGS. 1A to 1C, a display surface DD-IS is parallel to a plane defined by a first direction axis DR1 and a second direction axis DR2. A third direction axis DR3 indicates a perpendicular direction to the display surface DD-IS, for example, a thickness direction of the display device DD. A front surface (or an upper surface) and a rear surface (or a lower surface) of each member are distinguished based on the third direction axis DR3. Hereinafter, first to third directions are directions indicated by the first to third direction axes DR1, DR2, and DR3, respectively, and refer to the same reference numerals.

As illustrated in FIGS. 1A to 1C, the display surface DD-IS includes a display area DD-DA in which an image IM is displayed, and a non-display area DD-NDA adjacent to the display area DD-DA. The non-display area DD-NDA is an area in which an image is not displayed. FIGS. 1A to 1C illustrate icon images as an example of the image IM. As an example, the display area DD-DA may have a rectangular shape. The non-display area DD-NDA may surround the display area DD-DA. However, the disclosure is not limited thereto, and a shape of the display area DD-DA and a shape of the non-display area DD-NDA may be modified.

As illustrated in FIGS. 1A to 1C, the display device DD may include areas defined depending on an operation type. The display device DD may include a folding area FA that is folded on the basis of a folding axis FX, a first flat area NFA1 and a second flat area NFA2 that are adjacent to the folding area FA. The folding area FA is an area that substantially forms a curvature.

In the embodiment, the display device DD in which the folding axis FX parallel to the first direction DR1 is defined is illustrated as an example. However, the disclosure is not limited thereto, and the folding axis FX may be parallel to the second direction DR2.

As illustrated in FIG. 1B, the display device DD may be in-folded or in-bent such that the display surface DD-IS of the first flat area NFA1 and the display surface DD-IS of the second flat area NFA2 face each other. As illustrated in FIG. 1C, the display device DD may be out-folded or out-bent such that the display surface DD-IS is exposed to the outside.

In an embodiment, the display device DD may include folding areas FA. The folding area FA may be defined to correspond to a form in which a user manipulates the display device DD. For example, the folding area FA may be defined in a diagonal direction crossing the first direction axis DR1 and the second direction axis DR2 in a plan view. The area of the folding area FA may not be fixed and may be determined depending on a radius of curvature. In an embodiment, the display device DD may be configured to repeat only an operation mode shown in FIGS. 1A and 1B, or may be configured to repeat only an operation mode shown in FIGS. 1A and 1C.

In this embodiment, the display device DD applied to a mobile phone is illustrated, but the disclosure is not limited thereto. In an embodiment, the display device DD may be applied to a small and medium-sized electronic device such as a tablet PC, a car navigation system, a game console, and a smartwatch in addition to a large electronic device such as a television and a monitor.

The display device DD according to the disclosure is not limited to a foldable display device. In an embodiment, the display device DD may be a non-foldable display device or a rollable display device.

Figure 2:
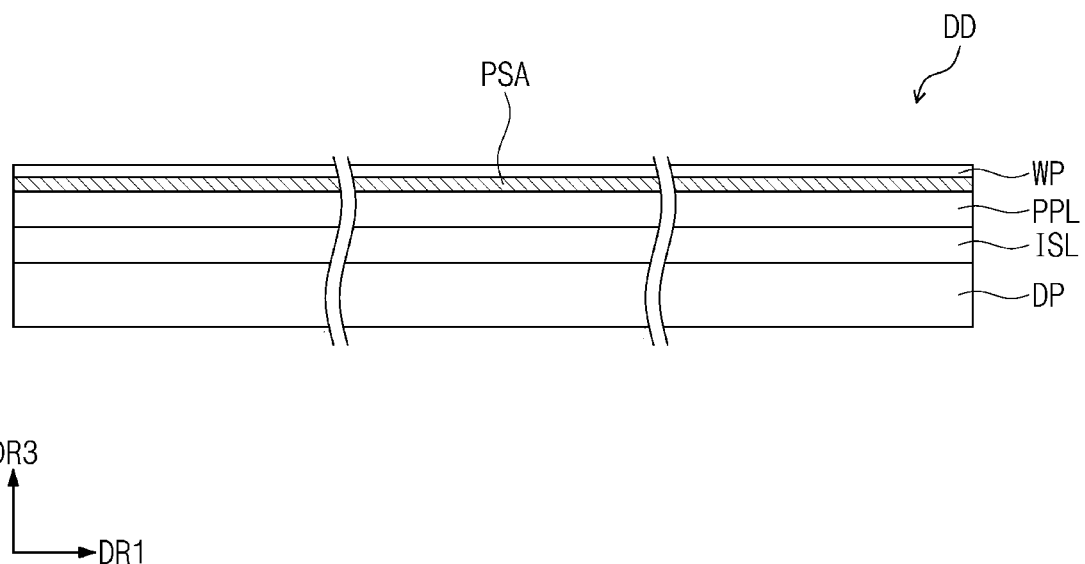
FIG. 2 is a schematic cross-sectional view of a display device according to an embodiment of the disclosure.

FIG. 2 is a schematic cross-sectional view of the display device DD according to an embodiment. FIG. 2 illustrates a cross section defined by the first direction axis DR1 and the third direction axis DR3. FIG. 2 simply illustrates the display device DD to explain a stacked structure of functional panels and/or functional units constituting the display device DD.

The display device DD according to an embodiment may include a display panel DP, an input sensor ISL, an optical control layer PPL, and a window WP. In an embodiment, the input sensor ISL may be omitted.

According to an embodiment, at least some components of the display panel DP, the input sensor ISL, the optical control layer PPL, and the window WP may be formed by a successive process, or at least some components thereof may be bonded to one another by an adhesive layer. The adhesive layer may not be disposed between the components formed by the successive process. In this embodiment, the adhesive layer may be a pressure sensitive adhesive (PSA) film. The adhesive layer described below may include a general adhesive or pressure-sensitive adhesive, and is not particularly limited.

The display panel DP generates an image. The display panel DP includes pixels. Each of the pixels includes a display element and a driving circuit which controls an operation of the display element. The driving circuit may include at least one transistor and a capacitor.

The display panel DP may include an image area DP-PA (refer to FIG. 4A) corresponding to the display area DD-DA and a non-image area corresponding to the non-display area DD-NDA (not shown).

The display panel DP according to an embodiment may be a light emitting display panel including a light emitting element as the display element, and is not particularly limited. For example, the display panel DP may be an organic light emitting display panel or an inorganic light emitting display panel. An emission layer of the organic light emitting display panel may include an organic light emitting material. An emission layer of the inorganic light emitting display panel may include a quantum dot, a quantum rod, or an inorganic LED. Hereinafter, the display panel DP will be described as an organic light emitting display panel.

The input sensor ISL is disposed on the display panel DP. The input sensor ISL obtains coordinate information of an external input (e.g., a touch event). The input sensor ISL may detect the external input by a capacitive method.

The optical control layer PPL may control a path of light (hereinafter referred to as a "source light") generated by the display panel DP. The optical control layer PPL may condense or concentrate light generated in a partial area of the display panel DP. The optical control layer PPL may further spread the light generated in the partial area of the display panel DP.

The optical control layer PPL may reduce reflectance of natural light (or sunlight) incident from an upper side of the window WP. The optical control layer PPL according to an embodiment may include a light blocking pattern. The optical control layer PPL according to an embodiment may include color filters. The color filters have an arrangement. The arrangement of the color filters may be determined in consideration of emission colors of pixels included in the display panel DP.

The window WP according to an embodiment may include a base layer (not shown) and a bezel layer (not shown). The base layer may have a multilayer structure. The base layer may include an organic substrate or a synthetic resin film.

The bezel layer partially overlaps the base layer. The bezel layer may define a bezel area of the display device DD, for example, the non-display area DD-NDA (refer to FIGS. 1A and 1C). In an embodiment, the bezel layer may be disposed in a different configuration (e.g., the optical control layer PPL).

Although not shown in the drawings, a protective member may be further disposed under the display panel DP. The protection member supports the display panel DP and protects the display panel DP from external impact.

Figure 3:
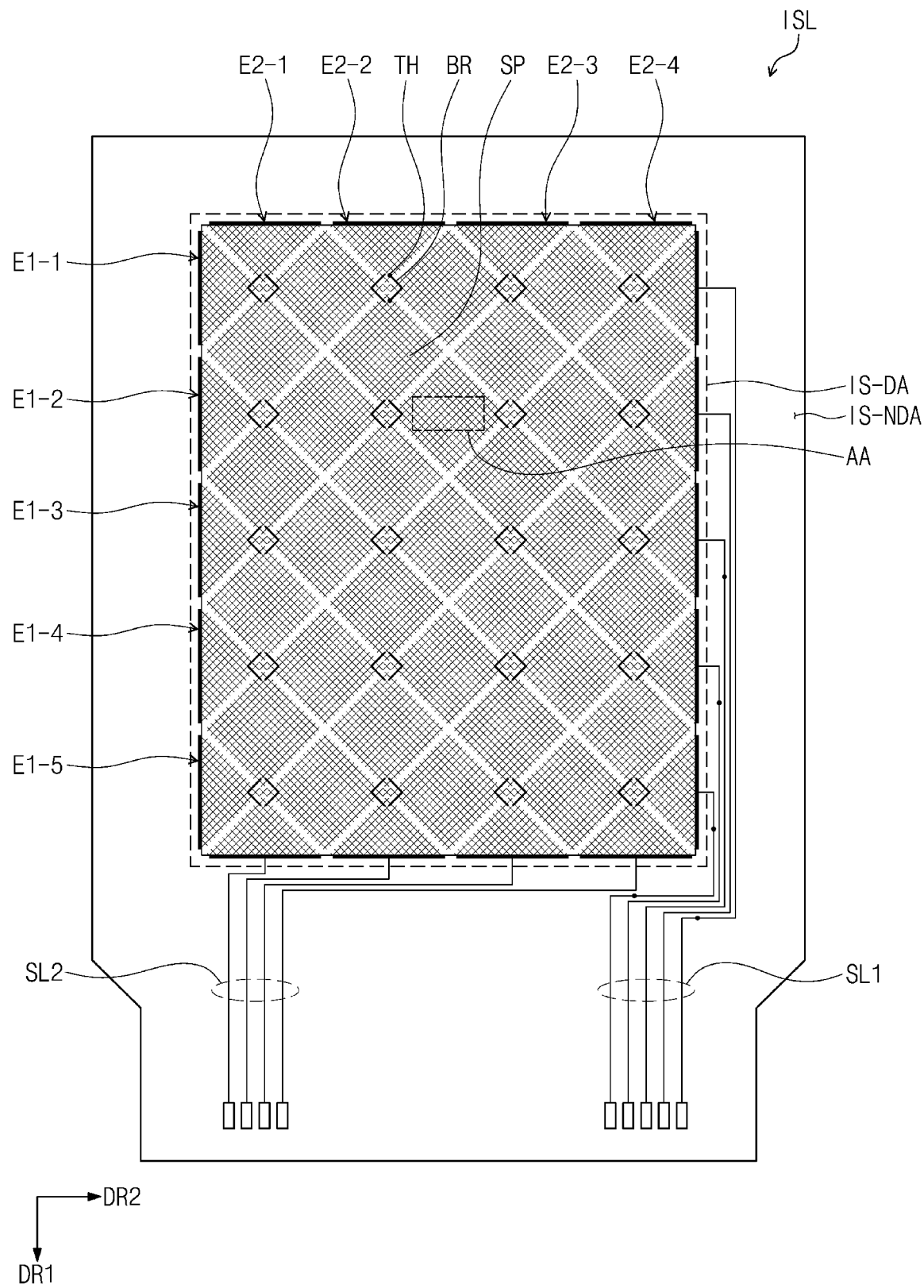
FIG. 3 is a schematic plan view of an input sensor according to an embodiment of the disclosure.
Figure 4A:
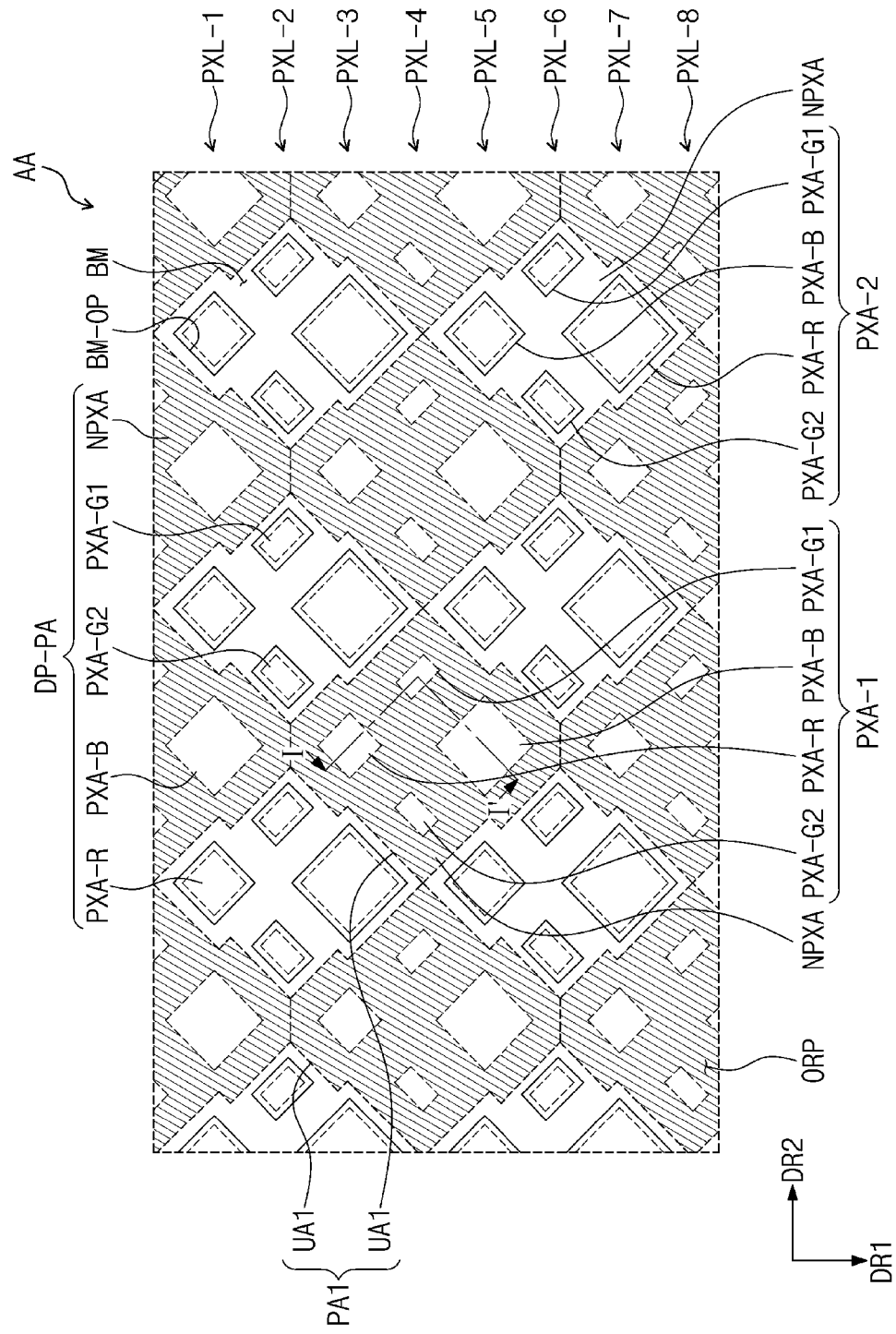
FIGS. 4A to 4C are schematic enlarged plan views corresponding to a partial area AA of FIG. 3.
Figure 4B:
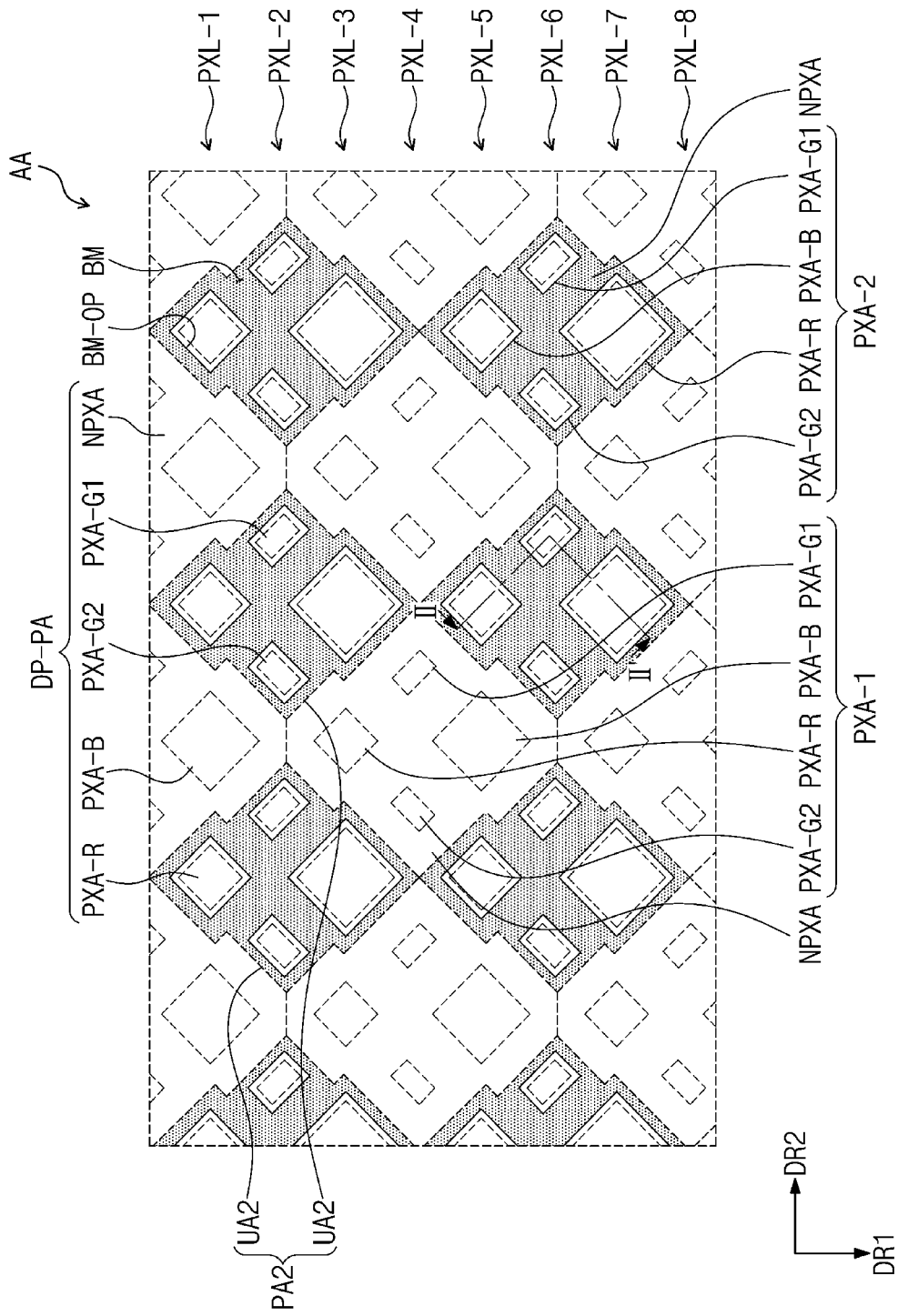
Figure 4C:
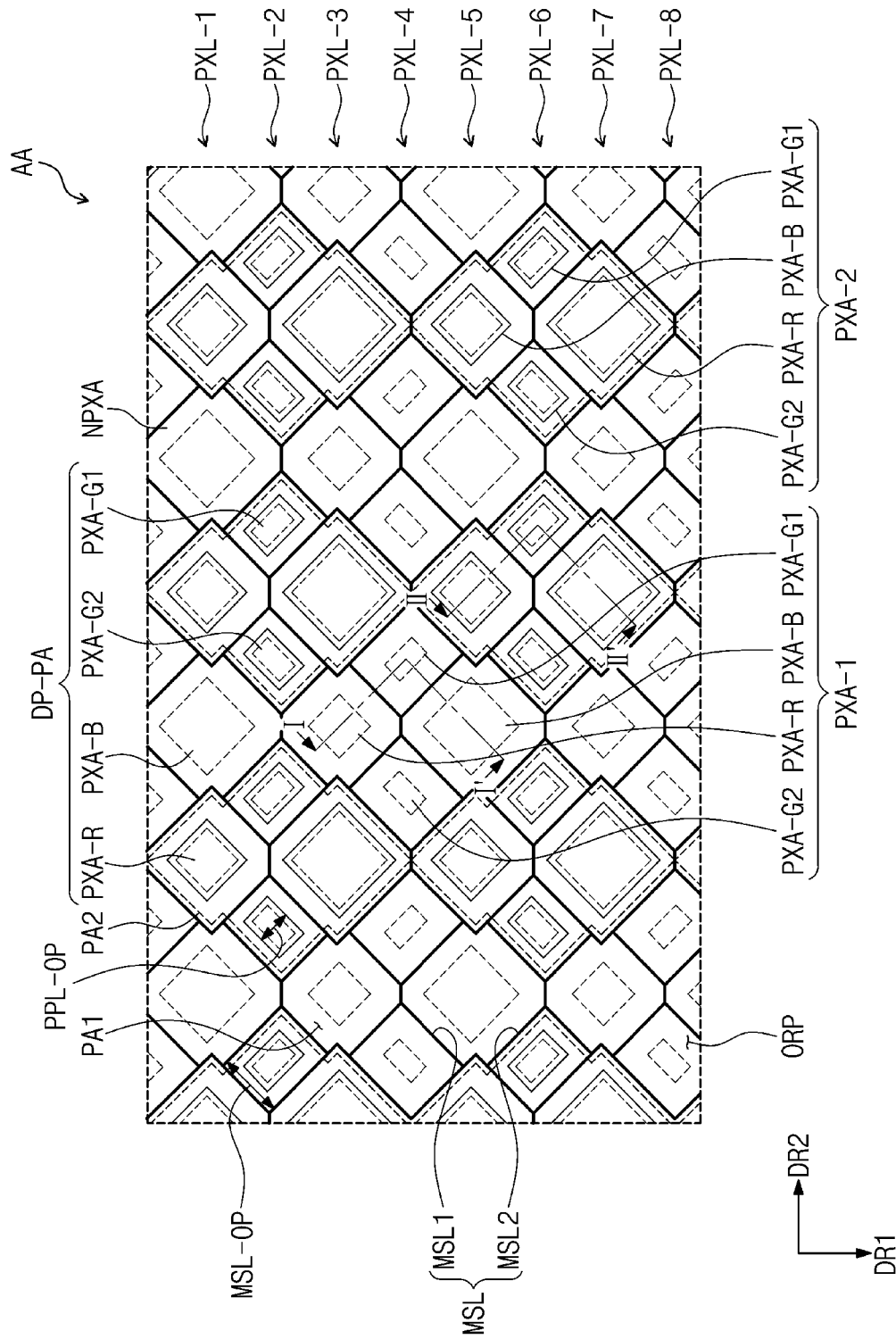
Figure 4D:
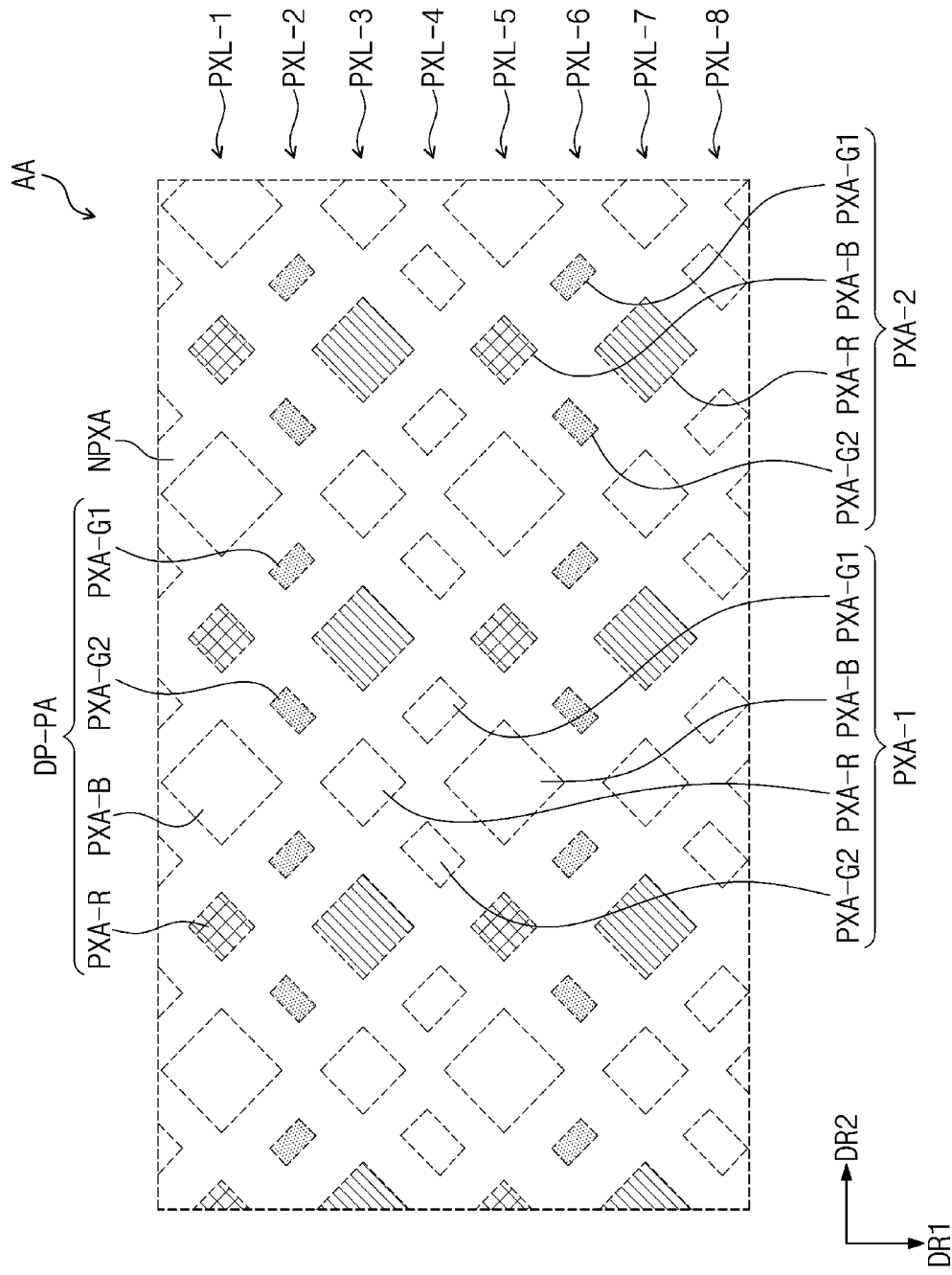
FIG. 4D is a schematic plan view illustrating a pixel activated in a first operation mode.
Figure 4E:
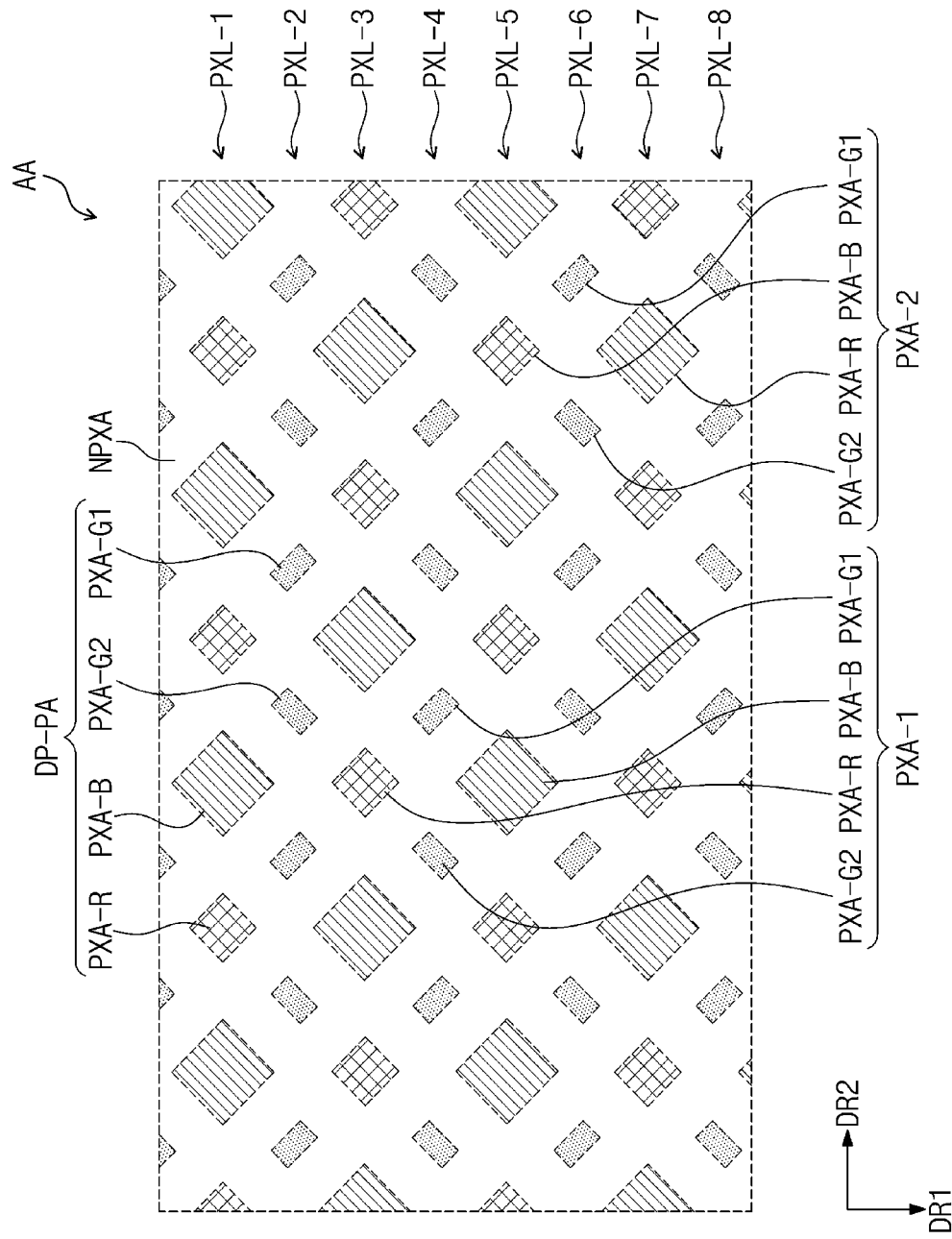
FIG. 4E is a schematic plan view illustrating a pixel activated in a second operation mode.

FIG. 3 is a schematic plan view of the input sensor ISL according to an embodiment. FIGS. 4A to 4C are schematic enlarged plan views corresponding to area AA of FIG. 3. FIG. 4D is a schematic plan view illustrating a pixel activated in a first operation mode. FIG. 4E is a schematic plan view illustrating a pixel activated in a second operation mode.

As shown in FIG. 3, the input sensor ISL includes a sensing area IS-DA and a non-sensing area IS-NDA adjacent to the sensing area IS-DA. The sensing area IS-DA and the non-sensing area IS-NDA correspond to the display area DD-DA and the non-display area DD-NDA shown in FIG. 1A, respectively.

First electrodes E1-1 to E1-5 and second electrodes E2-1 to E2-4 are disposed to cross one another and to be insulated from one another in the sensing area IS-DA. First signal lines SL1 electrically connected to the first electrodes E1-1 to E1-5 and second signal lines SL2 electrically connected to the second electrodes E2-1 to E2-4 are disposed in the non-sensing area IS-NDA. One of the first signal lines SL1 and the second signal lines SL2 transmits a transmission signal for detecting an external input from an external circuit to the corresponding electrodes thereto, and another thereof transmits a change in capacitance between the first electrodes E1-1 to E1-5 and the second electrodes E2-1 to E2-4 to the external circuit as a received signal.

Conductive mesh lines defining sensor openings of the first electrodes E1-1 to E1-5 and the second electrodes E2-1 to E2-4 may be provided. The conductive mesh lines may be cut to form the first electrodes E1-1 to E1-5 having an integral shape. The conductive mesh lines may be cut to form sensing patterns SP of the second electrodes E2-1 to E2-4. The sensing patterns SP of the second electrodes E2-1 to E2-4 and the first electrodes E1-1 to E1-5 are disposed on the same layer and may have the same stack structure.

Bridge patterns BR are disposed on a layer different from a layer forming the first electrodes E1-1 to E1-5. Each of the bridge patterns BR electrically connects two adjacent sensing patterns SP in the first direction DR1. The corresponding sensing pattern SP and the corresponding bridge pattern BR are electrically connected to each other through a contact hole TH penetrating an insulating layer (e.g., a third insulating layer IS-IL3 of FIGS. 6A and 6B) disposed between the sensing patterns SP and the bridge patterns BR. In FIG. 3, the input sensor ISL, in which two bridge patterns BR are disposed in each crossing region of the first electrodes E1-1 to E1-5 and the second electrodes E2-1 to E2-4, is illustrated as an example.

For the clarity of description, in FIGS. 4A to 4C, components forming (or constituting) the display device DD are divided and illustrated. A planar shape and arrangement of the components constituting the display device DD will be described in detail with reference to FIGS. 4A to 4C.

FIGS. 4A and 4B illustrate emission regions PXA-R, PXA-G1, PXA-G2, and PXA-B and a peripheral region NPXA disposed in the image area DP-PA. The peripheral region NPXA sets a boundary between the emission regions PXA-R, PXA-G1, PXA-G2, and PXA-B. Each of the emission regions PXA-R, PXA-G1, PXA-G2, and PXA-B corresponds to an emission region PXA described with reference to FIG. 5.

A pixel is disposed in each of the emission regions PXA-R, PXA-G1, PXA-G2, and PXA-B. A light emitting element OLED (refer to FIG. 5) of the pixel is disposed in each of the emission regions PXA-R, PXA-G1, PXA-G2, and PXA-B. A driving circuit of pixels is disposed in the peripheral region NPXA. The driving circuit of the pixels may overlap the corresponding emission regions PXA-R, PXA-G1, PXA-G2, and PXA-B.

Hereinafter, for convenience of description, an arrangement of pixels is defined as being the same as an arrangement of the emission regions, and activation of the emission regions is defined as having the same meaning as activation of the pixels.

The emission regions PXA-R, PXA-G1, PXA-G2, and PXA-B may define pixel rows PXL-1 to PXL-8 extending in the second direction DR2 (or a row direction). The pixel rows PXL-1 to PXL-8 are arranged in the first direction DR1 (or a column direction).

The emission regions PXA-R, PXA-G1, PXA-G2, and PXA-B may include a first color emission region PXA-R for generating a first color, a second color emission region PXA-B for generating a second color, and third color emission regions PXA-G1 and PXA-G2 for generating a third color. In the embodiment, two types of third color emission regions PXA-G1 and PXA-G2 having different shapes in a plan view are illustrated, but the disclosure not limited thereto. In an embodiment, a type of the third color emission regions may be applied.

In the embodiment, the first color emission region PXA-R may generate red light, the second color emission region PXA-B may generate blue light, and the third color emission regions PXA-G1 and PXA-G2 may generate green light. However, the disclosure is not limited thereto. The color of lights emitted by the first color emission region PXA-R, the second color emission region PXA-B, and the third color emission regions PXA-G1 and PXA-G2 may be selected as a combination of three color lights that are capable of being mixed to generate white color light.

In the embodiment, the first color emission region PXA-R, the second color emission region PXA-B, and the third color emission regions PXA-G1 and PXA-G2 having different areas in a plan view are illustrated as an example, but the disclosure is not limited thereto. Among the emission regions, the area of the second color emission region PXA-B is shown to be the largest, and the area of each of the third color emission regions PXA-G1 and PXA-G2 is the smallest, but it is only an example.

Emission regions PXA-R, PXA-G1, PXA-G2, and PXA-B, or pixels may be divided into two groups. As described below, emission regions of a first group are deactivated in a first operation mode and activated in a second operation mode. Emission regions of a second group are activated in each of the first operation mode and the second operation mode. The first operation mode and the second operation mode may be set by a user's selection.

Referring to FIGS. 4A and 4B, the image area DP-PA may include a first area PA1 in which emission regions PXA-1 of the first group are disposed and a second area PA2 in which emission regions PXA-2 of the second group is disposed. As shown in FIG. 4A, emission regions PXA-1 of the first group are disposed in the first area PA1, and the peripheral region NPXA adjacent to the emission regions PXA-1 is disposed. In FIG. 4A, hatching represents an organic pattern ORP overlapping the first area PA1 and not overlapping the second area PA2.

As illustrated in FIG. 4B, emission regions PXA-2 of the second group are disposed in the second area PA2, and the peripheral region NPXA adjacent to the emission regions PXA-2 is disposed. Substantially, a division between the first area PA1 and the second area PA2 may be determined by a light blocking pattern BM. As illustrated in FIG. 4B, the light blocking pattern BM disposed in the second area PA2 is indicated by hatching, and an outer edge of the light blocking pattern BM may correspond to a boundary between the first area PA1 and the second area PA2. In an embodiment, the light blocking pattern BM may overlap the adjacent organic pattern ORP. Even in such a case, the first area PA1 and the second area PA2 are divided by the outer edge of the light blocking pattern BM.

As shown in FIG. 4A, the first area PA1 includes unit areas UA1. To separately illustrate the organic pattern ORP to correspond to the unit areas UA1, FIG. 4A illustrates a dotted line extending in the second direction DR2.

As shown in FIG. 4B, the second area PA2 may also include unit areas UA2. One of the light blocking patterns BM may be disposed to correspond to a unit area UA2. The first color emission region PXA-R, the second color emission region PXA-B, and the two third emission regions PXA-G1 and PXA-G2 are disposed in each of the unit area UA1 of the first area PA1 and the unit area UA2 of the second area PA2.

In the unit area UA1 of the first area PA1 and the unit area UA2 of the second area PA2, the emission region PXA-1 of the first group and the emission region PXA-2 of the second group may have the same arrangement (or the same pixel arrangement). In the light blocking pattern BM corresponding to the unit area UA2 of the second area PA2, light blocking openings BM-OP corresponding to the one first color emission region PXA-R, the one second color emission region PXA-B, and the two third color emission regions PXA-G1 and PXA-G2 may be defined, respectively. Each of the light blocking openings BM-OP may have an area larger than that of the corresponding emission region.

FIG. 4C illustrates a mesh line MSL disposed in the peripheral region NPXA. The mesh line MSL may include a first mesh line MSL1 extending in a first crossing direction and a second mesh line MSL2 extending in a second crossing direction.

The mesh line MSL may define sensor openings MSL-OP corresponding to the emission regions PXA-R, PXA-G1, PXA-G2, and PXA-B. Each of the sensor openings MSL-OP may have an area larger than that of a corresponding emission region among the emission regions PXA-R, PXA-G1, PXA-G2, and PXA-B. Each of the sensor openings MSL-OP may have an area larger than that of a corresponding light blocking opening among the light blocking openings BM-OP illustrated in FIGS. 4A and 4B.

FIG. 4C illustrates openings PPL-OP disposed in the second area PA2 of an organic layer PPL-1. The openings PPL-OP correspond to the emission regions PXA-R, PXA-G1, PXA-G2, and PXA-B, respectively. The openings PPL-OP of the organic layer PPL-1 may have an area smaller than that of a corresponding light blocking opening among the light blocking openings BM-OP illustrated in FIG. 4A.

Referring to FIG. 4D, in the first operation mode, the emission region PXA-1 of the first group is deactivated (or not activated), and the emission region PXA-2 of the second group is activated. The activated emission region PXA-2 of the second group is filled with hatching, and the deactivated emission region PXA-1 of the first group is emptied and indicated only by a dotted line.

In the first operation mode, the display device DD generates an image only in the emission region PXA-2 of the second group. The image generated in the first operation mode is provided with a narrow viewing angle. A detailed description thereof will be made below.

Referring to FIG. 4E, in the second operation mode, both the emission region PXA-1 of the first group and the emission region PXA-2 of the second group are activated. This operation is substantially the same as that of a general display device. In the second operation mode, the emission region PXA-1 of the first group still provides light in a narrow range. The emission region PXA-2 of the second group may provide light in a wider range than that of the emission region PXA-1 of the first group. A detailed description thereof will be made below.

Figure 5:
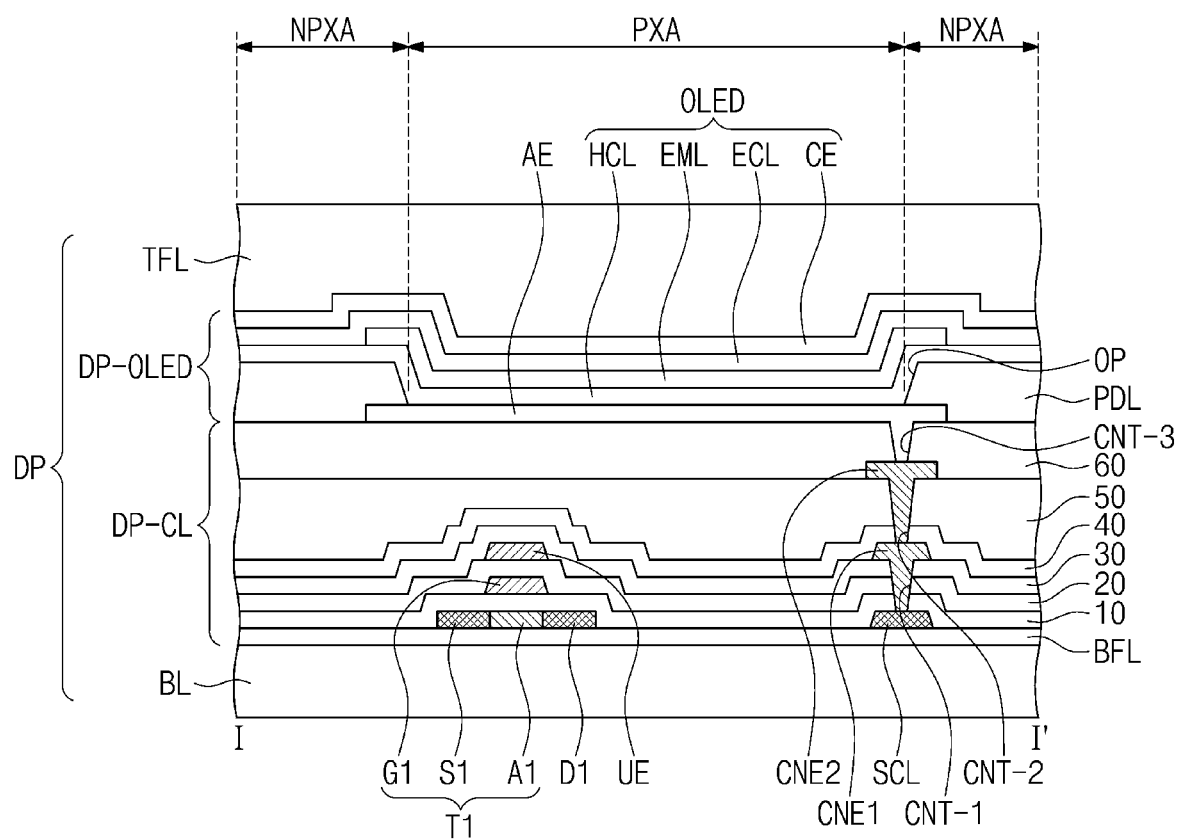
FIG. 5 is a schematic cross-sectional view of a display panel according to an embodiment of the disclosure.
Figure 6A:
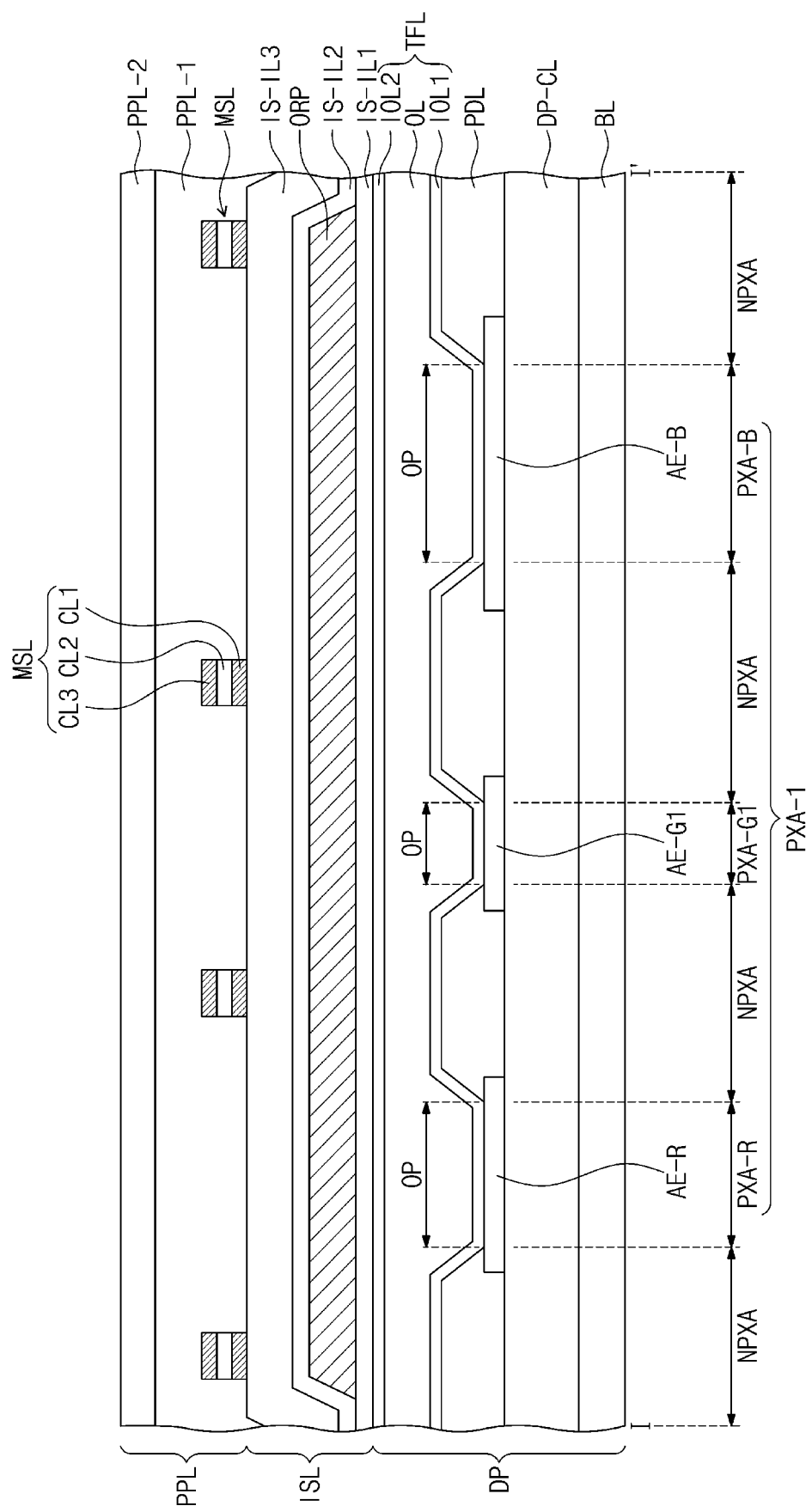
FIG. 6A is a schematic cross-sectional view taken along line I-I' of FIGS. 4A and 4C of a display device according to an embodiment of the disclosure.
Figure 6B:
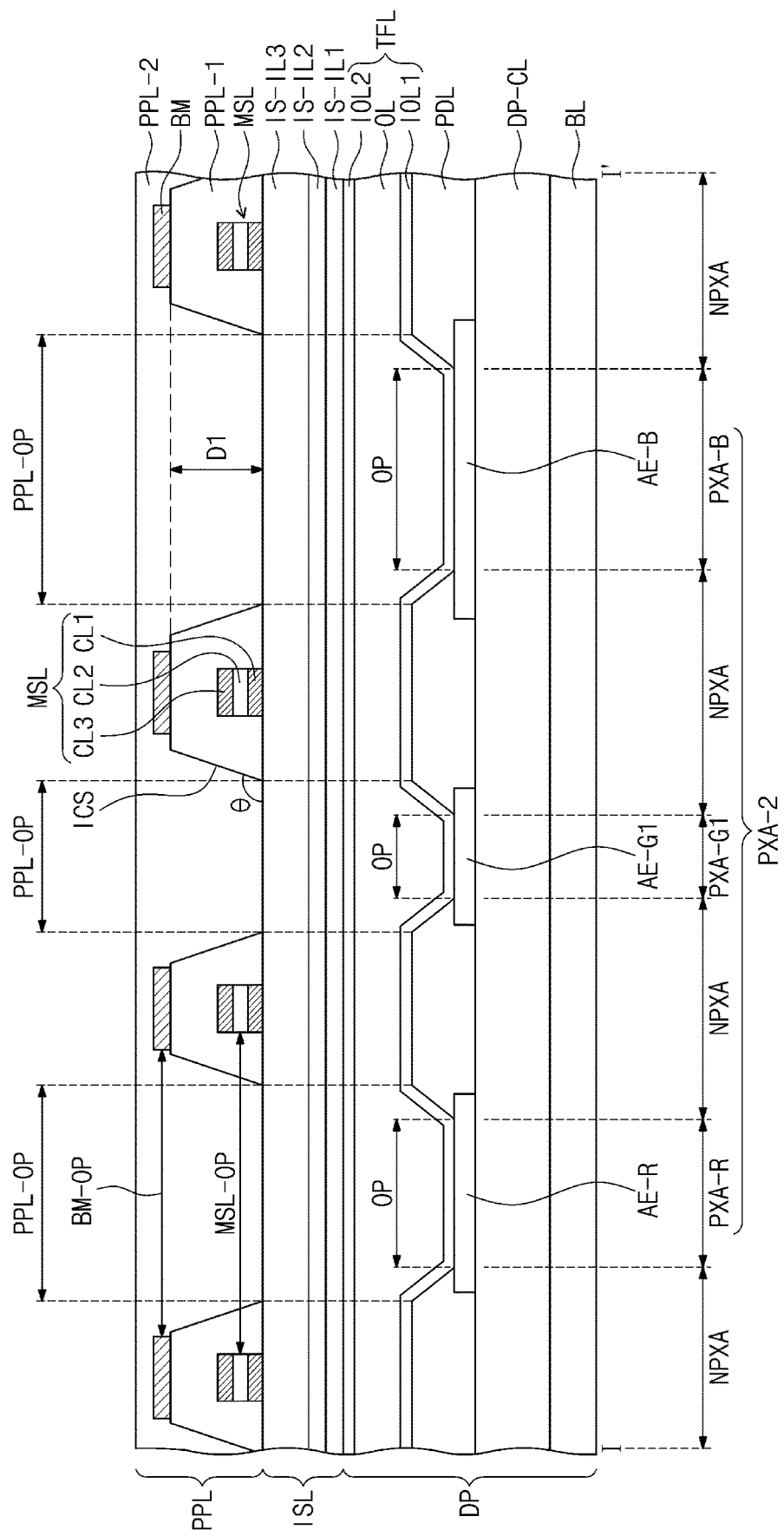
FIG. 6B is a schematic cross-sectional view taken along line II-IT of FIGS. 4B and 4C of a display device according to an embodiment of the disclosure.

FIG. 5 is a schematic cross-sectional view of the display panel DP according to an embodiment. FIG. 6A is a schematic cross-sectional view taken along line I-I' of FIGS. 4A and 4C of the display device DD according to an embodiment. FIG. 6B is a schematic cross-sectional view taken along line II-IT' of FIGS. 4B and 4C of the display device DD according to an embodiment.

An emission region PXA shown in FIG. 5 may correspond to one of the emission regions PXA-R, PXA-G1, PXA-G2, and PXA-B shown in FIG. 4A. The display panel DP may include a base layer BL, a circuit device layer DP-CL, a display device layer DP-OLED, and an upper insulating layer TFL. A stacked structure of the display panel DP is not particularly limited thereto.

Referring to FIG. 5, the display panel DP may include insulating layers, a semiconductor pattern, a conductive pattern, and a signal line. An insulating layer, a semiconductor layer, and a conductive layer are formed by a method such as coating or vapor deposition. Thereafter, the insulating layer, the semiconductor layer, and the conductive layer may be selectively patterned by photolithography and etching. In this way, the semiconductor pattern, the conductive pattern, the signal line, and the like included in the circuit device layer DP-CL and the display device layer DP-OLED are formed.

The base layer BL may include a synthetic resin film. The base layer BL may include a glass substrate, a metal substrate, or an organic/inorganic composite material substrate.

At least one inorganic layer is disposed on an upper surface of the base layer BL. A buffer layer BFL improves a bonding force between the base layer BL and the semiconductor pattern. The buffer layer BFL may include a silicon oxide layer and a silicon nitride layer. The silicon oxide layer and the silicon nitride layer may be alternately stacked.

The semiconductor pattern is disposed on the buffer layer BFL. The semiconductor pattern may include polysilicon. However, the disclosure is not limited thereto, and the semiconductor pattern may include amorphous silicon or metal oxide.

FIG. 5 only illustrates some semiconductor patterns, and semiconductor patterns may be further disposed to correspond to the emission regions PXA-R, PXA-G1, PXA-G2, and PXA-B (refer to FIG. 4A) in a plan view. The semiconductor pattern may be arranged in a specific rule throughout the emission regions PXA-R, PXA-G1, PXA-G2, and PXA-B. The semiconductor pattern has different electrical properties depending on whether it is doped or not doped with impurities. The semiconductor pattern may include a first area having a high doping concentration and a second area having a low doping concentration. The first area may be doped with an N-type dopant or a P-type dopant. A P-type transistor includes a first area doped with a P-type dopant.

The first area has higher conductivity than that of the second area and substantially functions as an electrode or a signal line. The second area substantially corresponds to an active (or channel) of the transistor. For example, a part of the semiconductor pattern may be an active of the transistor, another part thereof may be a source or drain of the transistor, and another part thereof may be a conductive region.

As shown in FIG. 5, a source S1, an active A1, and a drain D1 of a transistor T1 are formed from a semiconductor pattern. FIG. 5 illustrates a part of a signal transmission region SCL formed from a semiconductor pattern. Although not shown separately in the drawings, the signal transmission region SCL may be connected to the drain D1 of the transistor T1 in a plan view.

First to sixth insulating layers 10 to 60 are disposed on the buffer layer BFL. Each of the first to sixth insulating layers 10 to 60 may be an inorganic layer or an organic layer. A gate G1 may be disposed on the first insulating layer 10. An upper electrode UE may be disposed on the second insulating layer 20. A first connection electrode CNE1 may be disposed on the third insulating layer 30. The first connection electrode CNE1 may be electrically connected to the signal transmission region SCL through a contact hole CNT-1 penetrating the first to third insulating layers 10 to 30. A second connection electrode CNE2 may be disposed on the fifth insulating layer 50. The second connection electrode CNE2 may be electrically connected to the first connection electrode CNE1 through a contact hole CNT-2 penetrating the fourth insulating layer 40 and the fifth insulating layer 50.

The light emitting element OLED is disposed on the sixth insulating layer 60. A first electrode AE is disposed on the sixth insulating layer 60. The first electrode AE is electrically connected to the second connection electrode CNE2 through a contact hole CNT-3 penetrating through the sixth insulating layer 60. An opening OP is defined in a pixel defining layer PDL. The opening OP exposes at least a portion of the first electrode AE. Substantially, the emission region PXA may be defined to correspond to a partial region of the first electrode AE exposed by the opening OP. The peripheral region NPXA corresponds to a region excluding the display area DD-DA in the display area DD-DA (refer to FIG. 1A).

A hole control layer HCL may be disposed throughout the emission region PXA and the peripheral region NPXA. The hole control layer HCL may include a hole transport layer and may further include a hole injection layer. An emission layer EML is disposed on the hole control layer HCL. The emission layer EML may be disposed in a region corresponding to the opening OP. For example, the emission layer EML may be formed separately in each of the emission regions PXA-R, PXA-G1, PXA-G2, and PXA-B.

An electron control layer ECL is disposed on the emission layer EML. The electron control layer ECL may include an electron transport layer and may further include an electron injection layer. A second electrode CE is disposed on the electron control layer ECL.

The upper insulating layer TFL is disposed on the second electrode CE. The upper insulating layer TFL may include thin films. In an embodiment, the upper insulating layer TFL may include a capping layer and a thin encapsulation layer disposed on the capping layer.

FIG. 6A is a schematic cross-sectional view corresponding to the emission region PXA-1 of the first group. FIG. 6B is a schematic cross-sectional view corresponding to the emission region PXA-2 of the second group. A difference between cross sectional stacked structures of a stacked structure on the emission region PXA-1 of the first group and a stacked structure on the emission region PXA-2 of the second group will be described with reference to FIGS. 6A and 6B.

Referring to FIGS. 6A and 6B, first electrodes AE-R, AE-B, and AE-G1 respectively corresponding to the first color emission region PXA-R, the second color emission region PXA-B, and the third color emission region PXA-G1 are disposed on the circuit device layer DP-CL. The openings OP of the pixel defining layer PDL corresponding to the first color emission region PXA-R, the second color emission region PXA-B, and the third color emission region PXA-G1 are defined in the pixel defining layer PDL. FIGS. 6A and 6B illustrate only some components of the light emitting element OLED to avoid repetitive illustrations. Refer to FIG. 5 for a detailed structure of the light emitting element OLED.

The upper insulating layer TFL may include a first encapsulation inorganic layer IOL1, an organic layer OL, and a second encapsulation inorganic layer IOL2. This three-layer structure may be defined as the thin-film encapsulation layer.

The input sensor ISL may be directly disposed on the upper insulating layer TFL. The input sensor ISL may include at least one insulating layer IS-IL1, IS-IL2, and IS-IL3, the organic pattern ORP, and the mesh line MSL. The insulating layers IS-IL1, IS-IL2, and IS-IL3 of the input sensor ISL include at least one inorganic layer. FIG. 6A illustrates, as an example, the input sensor ISL in which each of the first and second insulating layers IS-IL1 and IS-IL2 is an inorganic layer and the third insulating layer IS-IL3 is an organic layer. In an embodiment, the third insulating layer IS-IL3 may be an inorganic layer.

As illustrated in FIG. 6A, the organic pattern ORP may be disposed between the first insulating layer IS-IL1 and the second insulating layer IS-IL2. The organic pattern ORP may extend the viewing angle. In case that the display device DD is operated in the above-described second operation mode, light generated in the emission region PXA-1 of the first group is provided with a narrow viewing angle while light generated in the emission region PXA-2 of the second group is provided with a wide viewing angle. A detailed description thereof will be described with reference to FIGS. 8A to 8C.

The mesh line MSL may be directly disposed on the third insulating layer IS-IL3.

Although not shown separately, the bridge pattern BR (refer to FIG. 3) may be disposed between the second insulating layer IS-IL2 and the third insulating layer IS-IL3. In an embodiment, the input sensor ISL may further include an inorganic layer directly covering (or overlapping) the mesh line MSL.

The mesh line MSL may have a multilayer structure. The mesh line MSL may include a first layer CL1, a second layer CL2, and a third layer CL3. The first layer CL1 may have a higher bonding rate with respect to the insulating layer than that of the second layer CL2, the second layer CL2 may have a higher conductivity than those of the first and third layers CL1 and CL3, and the third layer CL3 may have a lower reflectance with respect to external light than that of the second layer CL2. For example, the mesh line MSL may have a multilayer structure in which titanium/aluminum/titanium are stacked in the order.

However, the disclosure is not limited thereto, and the multilayered conductive layer may include at least two of transparent conductive layers and metal layers. The multilayered conductive layer may include metal layers including different metals. The transparent conductive layer may include indium tin oxide (ITO), indium zinc oxide (IZO), zinc oxide (ZnO), indium tin zinc oxide (ITZO), poly(3,4-ethylenedioxythiophene) (PEDOT), metal nanowires, and graphene. The metal layer may include molybdenum, silver, titanium, copper, aluminum, and alloys thereof.

In an embodiment, the mesh line MSL may be omitted. In case that the mesh line MSL is omitted, the external input may not be detected, but the organic pattern ORP may still be disposed for function of an optical pattern.

As illustrated in FIGS. 6A and 6B, the optical control layer PPL may be directly disposed on the input sensor ISL. The optical control layer PPL may include the organic layer PPL-1, the light blocking pattern BM, and a planarization layer PPL-2. In an embodiment, the planarization layer PPL-2 may be omitted, and an adhesive layer PSA bonding the window WP (refer to FIG. 2) may replace the planarization layer PPL-2.

An opening PPL-OP corresponding to the emission region PXA-2 of the second group is defined in the organic layer PPL-1. The organic layer PPL-1 may cover (or overlap) the mesh line MSL. The organic layer PPL-1 may include an acrylate-based resin, an epoxide-based resin, a siloxane-based resin, a polyimide-based resin, or a mixture thereof. The organic layer PPL-1 may include particles having a low refractive index. The organic layer PPL-1 may include hollow silica particles.

As illustrated in FIG. 6B, the organic layer PPL-1 may include an inclined surface ICS defining the opening PPL-OP. An angle Θ formed between the inclined surface ICS and a top surface of the third insulating layer IS-IL3 exposed to the opening PPL-OP may have an obtuse angle. The angle Θ may be greater than about 90° and less than about 135°.

The light blocking pattern BM is disposed on the organic layer PPL-1, and the light blocking openings BM-OP are defined in the light blocking pattern BM. The light blocking pattern BM may be a pattern having a black color and may include a black coloring agent. The black coloring agent may include a black dye and a black pigment. The black coloring agent may include carbon black, a metal such as chromium, or an oxide thereof. A material used in a process of patterning the light blocking pattern BM (especially, KOH which is a component of a developer) may react with the mesh line MSL (especially, aluminum), and the organic layer PPL-1 serves as a barrier layer to prevent this reaction.

The planarization layer PPL-2 fills the opening PPL-OP. The planarization layer PPL-2 may have a greater refractive index than that of the organic layer PPL-1. The planarization layer PPL-2 may have a refractive index greater than that of the organic layer PPL-1 by about 0.5 or more. The refractive index of the organic layer PPL-1 may be about 1.4 to about 1.6, and the refractive index of the planarization layer PPL-2 may be about 1.6 to about 1.9.

The planarization layer PPL-2 may include an acrylate-based resin, an epoxide-based resin, a siloxane-based resin, a polyimide-based resin, a zirconium and hafnium acrylate-based resin, brominated aromatic acrylate-based resin, or a mixture thereof. The planarization layer PPL-2 may include particles having a high refractive index. The particles having the high refractive index may be zirconia ($ZrO_2$), titania ($TiO_2$), silica ($SiO_2$), or a mixture thereof, and a particle diameter thereof may be about 100 nm or less.

Source light generated from the light emitting element may be reflected from the inclined surface ICS and then may be provided in a vertical direction, and thus light concentration efficiency may be improved. Total reflection may be caused by a difference in refractive index between the planarization layer PPL-2 and the organic layer PPL-1, and thus light concentration efficiency may be improved. The light blocking pattern BM may prevent color mixing of adjacent pixels.

In case that the display device DD operates in the above-described first operation mode, the light generated in the emission regions PXA-2 of the second group is provided at a narrow viewing angle, and luminance of the light generated based on an emission region increases. Additional description thereof will be made with reference to FIG. 7.

The display device DD operating in the first operation mode may be used for a specific purpose. For example, the display device DD operating in a personal use mode may provide an image only to the user and prevent information of the image from leaking to neighbors adjacent to the user.

Figure 7:
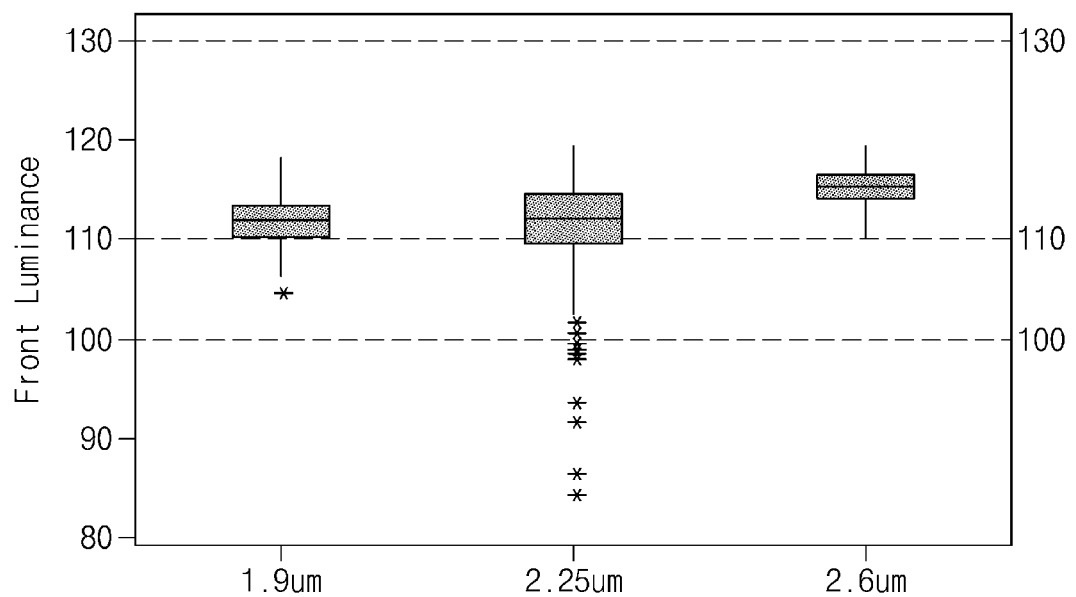
FIG. 7 is a schematic graph showing a front luminance depending on a thickness of an organic layer according to an embodiment of the disclosure.
Figure 8A:
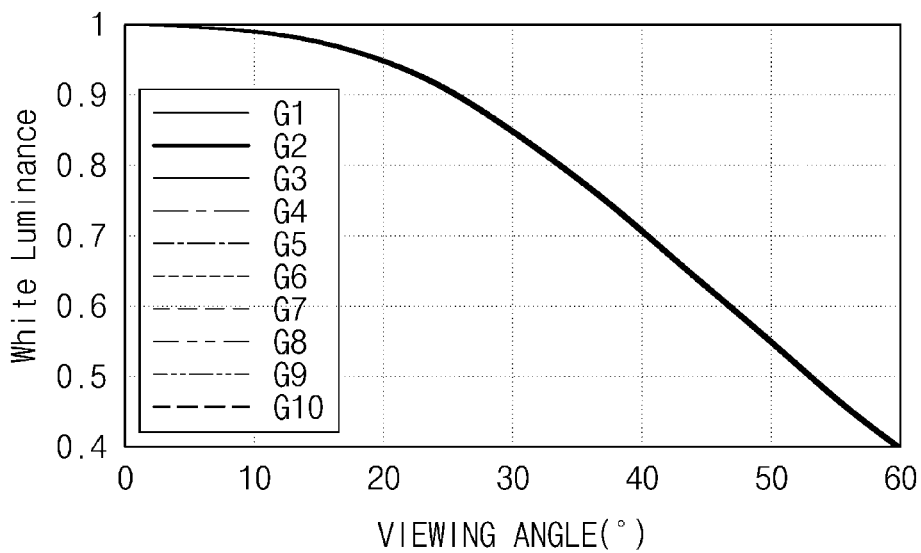
FIG. 8A is a schematic graph showing luminance for each of viewing angles of a display devices according to Comparative Examples and display devices according to Embodiments of the disclosure.
Figure 8B:
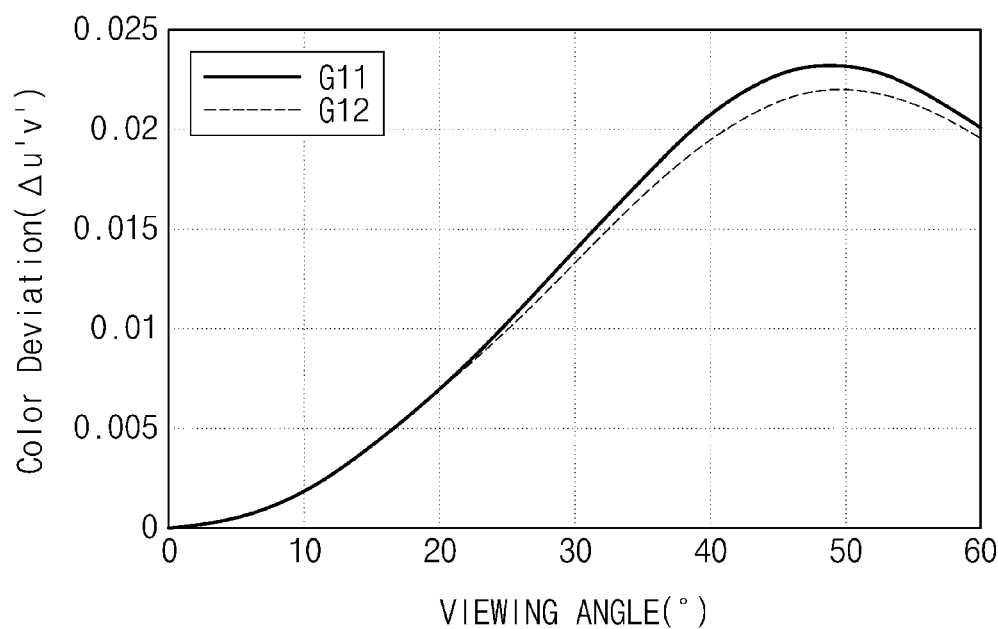
FIG. 8B is a schematic graph showing color deviations for each of viewing angles of a display device according to a material of an insulating layer.
Figure 8C:
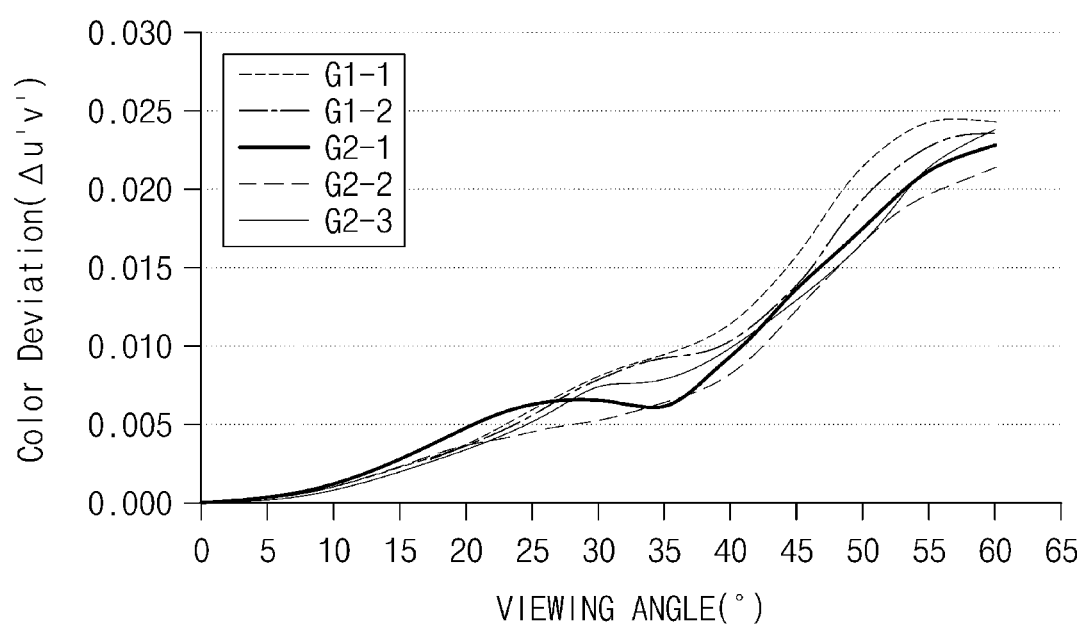
FIG. 8C is a schematic graph showing color deviations according to viewing angles of display devices according to Comparative Examples and display devices according to Embodiments of the disclosure.

FIG. 7 is a graph showing a front luminance depending on a thickness of an organic layer according to an embodiment. FIG. 8A is a graph showing luminance for each of viewing angles of display devices according to Comparative Examples and display devices according to Embodiments. FIG. 8B is a graph showing color deviations for each of viewing angles of a display device according to a material of the insulating layer IS-IL3. FIG. 8C is a graph showing color deviations according to viewing angles of display devices according to Comparative Examples and display devices according to Embodiments. FIGS. 7 to 8B illustrate simulation results, and FIG. 8C illustrates actual measurement values measured in a display device modeled in the same manner as the simulation.

FIG. 7 illustrates front luminance of light generated from the emission region PXA-2 of a second group. Unlike the emission region PXA-2 described with reference to FIG. 6B, the front luminance of light generated in the emission region in which the opening PPL-OP is not defined in the organic layer PPL-1 is set to about 100.

According to a left graph of FIG. 7, in case that the opening PPL-OP is defined in the organic layer PPL-1 of about 1.9 it may be seen that the front luminance is increased by about 12%. According to a middle graph of FIG. 7, in case that the opening PPL-OP is defined in the organic layer PPL-1 of about 2.25 it may be seen that the front surface luminance is increased by about 13%. According to a right graph of FIG. 7, in case that the opening PPL-OP is defined in the organic layer PPL-1 of about 2.6 it may be seen that the front surface luminance is increased by about 15%.

It may be seen that, as the thickness of the organic layer PPL-1 increases in a given range, the amount of light reflected from the inclined surface ICS (refer to FIG. 6B) increases, and thus light concentration efficiency is improved. Unlike a general display device, in the first operation mode, the emission region PXA-1 of the first group is deactivated, and the opening PPL-OP of the organic layer PPL-1 may compensate for the lowered image brightness due to a decrease in the number of activated pixels.

FIG. 8A illustrates white luminance depending on the viewing angles shown in the emission region PXA-1 of the first group. FIG. 8A illustrates luminance of mixed lights generated from a first color emission region PXA-R, a second color emission region PXA-B, and two third color emission regions PXA-G1 and PXA-G2 illustrated in FIGS. 4A to 4C.

A first graph G1 is an amount of change in white luminance according to a viewing angle in a display device according to Comparative Example 1. The display device according to Comparative Example 1 does not include the organic pattern ORP compared to the emission region PXA-1 of the first group illustrated in FIG. 6A and includes the third insulating layer IS-IL3 that is an inorganic layer. A second graph G2 is a change in white luminance according to a viewing angle in a display device according to Comparative Example 2. The display device according to Comparative Example 2 does not include the organic pattern ORP compared to the emission region PXA-1 of the first group illustrated in FIG. 6A.

The display device according to Comparative Example 2 includes a silicon nitride layer having a thickness of about 500 Å as the first insulating layer IS-IL1, a silicon nitride layer having a thickness of about 1,500 Å as the second insulating layer IS-IL2, an acrylate layer having a thickness of about 25,000 Å as the third insulating layer IS-IL3, and an acrylate layer having a thickness of about 17,500 Å as the organic layer PPL-1. The display device according to Comparative Example 1 includes a silicon nitride layer having a thickness of about 3,300 Å as the third insulating layer IS-IL3 instead of an acrylate layer having a thickness of about 25,000 Å.

Third graph to tenth graph G3 to G10 are the amount of change in white luminance according to viewing angles shown in display devices according to the embodiment. A display device of the third graph G3 further includes an acrylate organic pattern ORP having a thickness of about 15,000 Å disposed between the first insulating layer IS-IL1 and the second insulating layer IS-IL2 compared to the display device according to Comparative Example 2 and includes a silicon nitride layer having a thickness of about 3,300 Å as the third insulating layer IS-IL3.

A display device of the fourth graph G4 further includes an acrylate organic pattern ORP having a thickness of about 15,000 Å compared to the display device according to Comparative Example 2 and includes an acrylate layer having a thickness of about 1,000 Å as the third insulating layer IS-IL3. A display device of the fifth graph G5 further includes an acrylate organic pattern ORP having a thickness of about 15,000 Å compared to the display device according to Comparative Example 2 and includes an acrylate layer having a thickness of about 2,000 Å as the third insulating layer IS-IL3. A display device of the sixth graph G6 further includes an acrylate organic pattern ORP having a thickness of about 15,000 Å compared to the display device according to Comparative Example 2 and includes an acrylate layer having a thickness of about 3,000 Å as the third insulating layer IS-IL3. Substantially, display devices of the fourth to sixth graphs G4 to G6 and the display device shown in FIG. 6A have the same stacked structure and are different from one another only in the thicknesses of the third insulating layer IS-IL3.

A display device of the seventh graph G7 further includes an acrylate organic pattern ORP having a thickness of 30,000 Å disposed between the first insulating layer IS-IL1 and the second insulating layer IS-IL2 compared to the display device according to Comparative Example 2 and includes a silicon nitride layer having a thickness of about 3,300 Å as the third insulating layer IS-IL3.

A display device of the eighth graph G8 further includes an acrylate organic pattern ORP having a thickness of 30,000 Å compared to the display device according to Comparative Example 2 and includes an acrylate layer having a thickness of about 1,000 Å as the third insulating layer IS-IL3. A display device of the ninth graph G9 further includes an acrylate organic pattern ORP having a thickness of about 30,000 Å compared to the display device according to Comparative Example 2 and includes an acrylate layer having a thickness of about 2,000 Å as the third insulating layer IS-IL3. A display device of the tenth graph G10 further includes an acrylate organic pattern ORP having a thickness of about 30,000 Å compared to the display device according to Comparative Example 2 and includes an acrylate layer having a thickness of about 3,000 Å as the third insulating layer IS-IL3. Substantially, the display devices of the seventh to tenth graphs G7 to G10 and the display device shown in FIG. 6A have the same stacked structure and are different from one another only in the thicknesses of the third insulating layer IS-IL3.

Referring to the first to tenth graphs G1 to G10, it may be seen that the luminance of a white image depending on the viewing angle is not affected by the stacked structure of the insulating layer and the material of the insulating layer. Because the first to tenth graphs G1 to G10 in FIG. 8A have almost the same rate of change of white luminance depending on the viewing angle, the first to tenth graphs G1 to G10 are illustrated as one graph.

A first graph G11 illustrated in FIG. 8B represents a color deviation Au'v' depending on a viewing angle shown in the display device according to Comparative Example 1 described in FIG. 8A. A second graph G12 represents a color deviation Au'v' depending on a viewing angle shown in the display device according to Comparative Example 2 described in FIG. 8A.

It may be seen that the display device according to Comparative Example 2 has an increased color deviation at about 30° to about 60° compared to the display device according to Comparative Example 1. This is because the thickness of the third insulating layer IS-IL3 is increased and thus the resonance structure is changed.

A first graph G1-1 and a second graph G1-2 shown in FIG. 8C illustrate color deviations Au'v' depending on viewing angles measured in each of display devices modeled in the same manner as the display device according to Comparative Example 1 described in FIG. 8A.

A third graph to a fifth graph G2-1 to G2-3 represent color deviations Δu'v' depending on viewing angles measured in the display device according to the embodiment. A display device of the third graph G2-1 further includes an acrylate organic pattern ORP having a thickness of about 12,000 Å compared to the display device according to Comparative Example 2. A display device of the fourth graph G2-2 further includes an acrylate organic pattern ORP having a thickness of about 22,000 Å compared to the display device according to Comparative Example 2. A display device of the fifth graph G2-3 further includes an acrylate organic pattern ORP having a thickness of about 33,000 Å compared to the display device according to Comparative Example 2. The display devices of the third to fifth graphs G2-1 to G2-3 and the display devices of the first graph G1-1 and the second graph G1-2 have the same thicknesses and materials in the third insulating layers IS-IL3.

According to the third to fifth graphs G2-1 to G2-3, it may be seen that the color deviation is reduced in a range of about 30° to about 60° compared to the first graph G1-1 and the second graph G1-2. Unlike the comparison result of the first graph G11 and the second graph G1-2 referenced in FIG. 8B, the reduced color deviation in the third to fifth graphs G2-1 to G2-3 is because of an organic pattern ORP having a relatively great thickness. It is assumed that the organic pattern ORP increases the viewing angle.

In case that the first graph G1-1, the second graph G1-2, and the third to fifth graphs G2-1 to G2-3 are reviewed in more detail, they are shown in Tables 1 to 4 below. Values in Table 1 were measured based on a white image, values in Table 2 were measured based on a red image, values in Table 3 were measured based on a green image, and values in Table 4 were measured based on a blue image.

TABLE 1

|  | G1-1 | G1-2 | G2-1 | G2-2 | G2-3 |
| --- | --- | --- | --- | --- | --- |
| Front luminance (cd/m²) | 428.3 | 424.4 | 429.4 | 424.4 | 424.8 |
| Luminance amount at 45° to front luminance (%) | 50 | 49 | 48 | 51 | 50 |
| Luminance amount at 60° to front luminance (%) | 30 | 30 | 29 | 29 | 25 |
| 45° Color deviation (Δu'v') | 0.016 | 0.014 | 0.014 | 0.012 | 0.013 |
| 60° Color deviation (Δu'v') | 0.024 | 0.024 | 0.023 | 0.021 | 0.026 |

TABLE 2

|  | G1-1 | G1-2 | G2-1 | G2-2 | G2-3 |
| --- | --- | --- | --- | --- | --- |
| Front luminance (cd/m²) | 123.4 | 120.9 | 124.3 | 120.7 | 121.6 |
| Luminance amount at 45° to front luminance (%) | 50 | 50 | 48 | 51 | 51 |
| Luminance amount at 60° to front luminance (%) | 26 | 26 | 25 | 26 | 21 |
| 45° Color deviation (Δu'v') | 0.032 | 0.034 | 0.032 | 0.031 | 0.032 |
| 60° Color deviation (Δu'v') | 0.038 | 0.039 | 0.038 | 0.038 | 0.039 |

TABLE 3

|  | G1-1 | G1-2 | G2-1 | G2-2 | G2-3 |
| --- | --- | --- | --- | --- | --- |
| Front luminance (cd/m²) | 376.9 | 368.4 | 373.2 | 367 | 368.5 |
| Luminance amount at 45° to front luminance (%) | 51 | 49 | 48 | 51 | 50 |
| Luminance amount at 60° to front luminance (%) | 32 | 31 | 30 | 30 | 27 |

TABLE 3-continued

|  | G1-1 | G1-2 | G2-1 | G2-2 | G2-3 |
| --- | --- | --- | --- | --- | --- |
| 45° Color deviation (Δu'v') | 0.016 | 0.015 | 0.012 | 0.014 | 0.015 |
| 60° Color deviation (Δu'v') | 0.016 | 0.015 | 0.012 | 0.014 | 0.015 |

TABLE 4

|  | G1-1 | G1-2 | G2-1 | G2-2 | G2-3 |
| --- | --- | --- | --- | --- | --- |
| Front luminance (cd/m²) | 34.63 | 34.74 | 34.61 | 34.01 | 34.66 |
| Luminance amount at 45° to front luminance (%) | 46 | 45 | 45 | 45 | 46 |
| Luminance amount at 60° to front luminance (%) | 29 | 29 | 27 | 27 | 24 |
| 45° Color deviation (Δu'v') | 0.020 | 0.021 | 0.017 | 0.018 | 0.018 |
| 60° Color deviation (Δu'v') | 0.020 | 0.021 | 0.019 | 0.021 | 0.021 |

Referring to FIG. 8C and Tables 1 to 4, it may be seen that the display device according to the embodiment has the front luminance similar to that of the display device according to Comparative Example, and the side luminance is reduced to a similar level. In contrast, it may be seen that the display device according to the embodiment has the reduced color deviation depending on the viewing angle compared to the display device according to Comparative Example.

In the display device according to the embodiment, it may be seen that in case that the thickness of the organic pattern ORP increases and becomes larger than the reference value, a luminance amount at 60° relative to the front luminance decreases relatively much. In consideration of the result of the fifth graph G2-3, the thickness of the organic pattern ORP may be about 30,000 Å or less.

Figure 10:
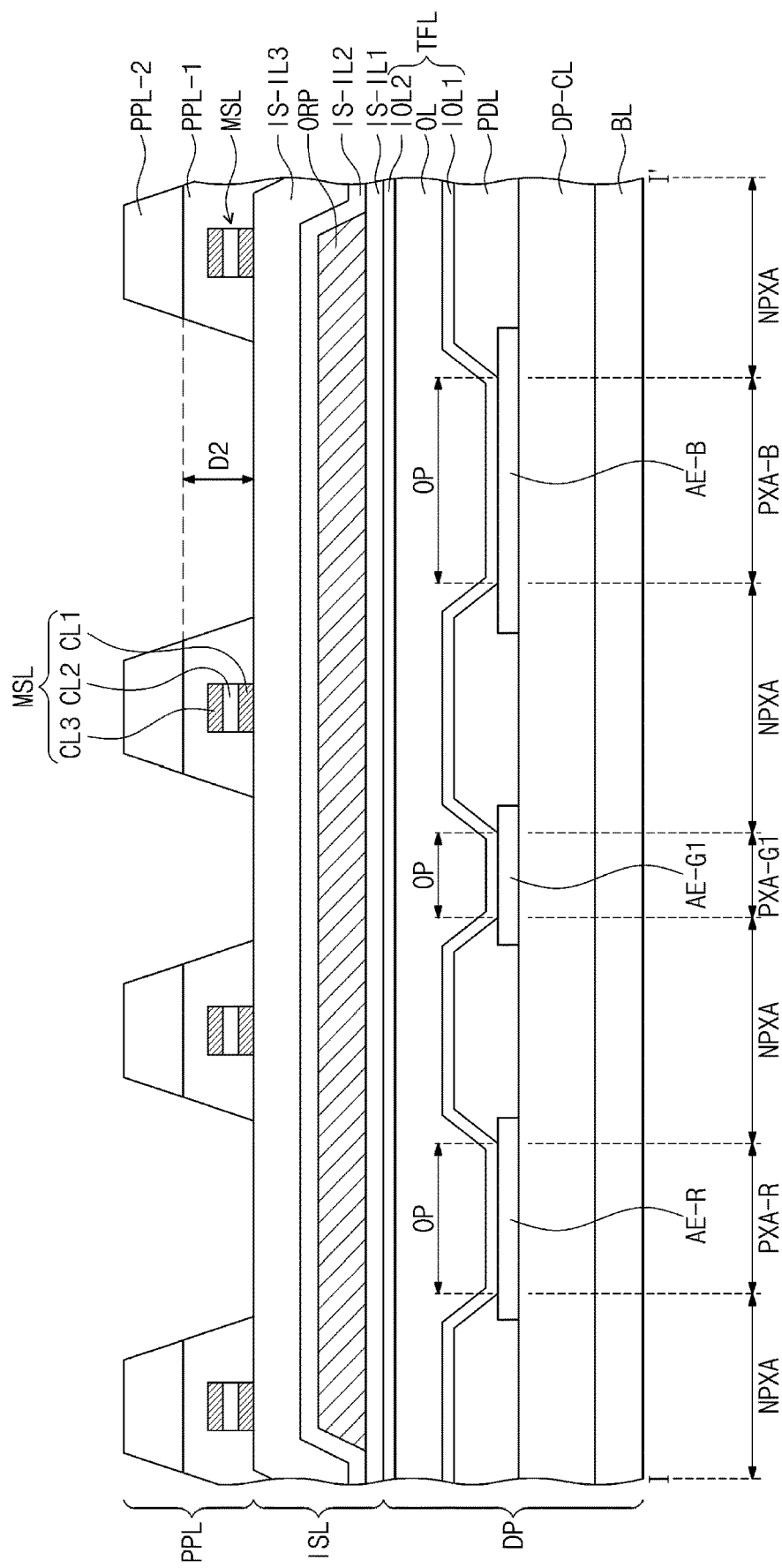
FIG. 10 is a schematic cross-sectional view taken along line I-I' of FIG. 4A of a display device according to an embodiment of the disclosure.

FIG. 9 is a schematic cross-sectional view taken along line II-IT of FIG. 4B of a display device according to an embodiment of the present disclosure. FIG. 10 is a schematic cross-sectional taken along line I-I' of FIG. 4A of a display device according to an embodiment of the present disclosure. Hereinafter, a detailed description of the same configuration as the configuration described with reference to FIGS. 1 to 8C will be omitted.

Referring to FIG. 9, a position of the light blocking pattern BM may be changed compared to the embodiment illustrated in FIG. 7. According to the embodiment, the light blocking pattern BM may be disposed on the planarization layer PPL-2. In an embodiment, an additional light blocking pattern may be disposed on the planarization layer PPL-2.

Referring to FIG. 10, an opening PPL-OP corresponding to the emission region PXA-1 of the first group may be further defined in the organic layer PPL-1. In a manufacturing process of the display device, in case that a pre-organic layer is formed on the third insulating layer IS-IL3, the pre-organic layer before curing has a thinner thickness in a region where the organic pattern ORP is disposed. This is because a liquid organic material has characteristics of flattening a stepped part. The stepped part is formed between the first area PA1 (refer to FIGS. 4A to 4C) and the second area PA2 (refer to FIGS. 4A to 4C) by the organic pattern ORP.

Accordingly, a depth D2 of the opening PPL-OP corresponding to the emission region PXA-1 of the first group is less than a depth D1 of the opening PPL-OP corresponding to the emission region PXA-2 of the second group shown in FIG. 6B. As a result, the light concentration efficiency of the emission region PXA-1 of the first group is relatively lower than that of the emission region PXA-2 of the second group.

According to the above, in the first operation mode, the display device may provide the image having the narrow viewing angle. The light provided from the pixels of the second group may be condensed by the organic layer, and the user may receive the source light of a relatively high luminance from the pixels of the second group.

In the second operation mode, the display device may provide the image having the wide viewing angle. The display device in the second operation mode may provide the light with the color deviation reduced by the organic pattern at the wide viewing angle. While the disclosure has been described with reference to embodiments thereof, it will be apparent to those of ordinary skill in the art that various changes and modifications may be made thereto without departing from the spirit and scope of the disclosure.

Therefore, the disclosed subject matter should not be limited to any single embodiment described herein, and the scope of the claimed invention shall be determined according to the attached claims.

What is claimed is:

1. A display device comprising:
    a display panel including:
        a base layer including a peripheral region and an emission region;
        an organic light emitting element disposed on the base layer, and including:
            a first electrode;
            a light emitting pattern disposed on the first electrode; and
            a second electrode disposed on the light emitting pattern; and
        a thin encapsulation layer overlapping the organic light emitting element;
    an input sensor to detect an external input;
    a first organic layer disposed on the thin encapsulation layer, and defining a first opening corresponding to the emission region; and
    a second organic layer filling the first opening, wherein
    the input sensor includes a conductive mesh line overlapping the peripheral region and defining a sensor opening corresponding to the emission region, and
    the conductive mesh line is disposed on the thin encapsulation layer and is covered by the first organic layer,
    a refractive index of the first organic layer is different from a refractive index of the second organic layer.

2. The display device of claim 1, further comprising:
    at least one insulating layer disposed between the display panel and the first organic layer, wherein
    the display panel includes:
        a first area including a first peripheral region and a first emission region of a pixel of a first group; and
        a second area including a second peripheral region and a second emission region of a pixel of a second group, and
    a first stacked structure is disposed on the display panel and overlaps the first area,
    a second stacked structure is disposed on the display panel and overlaps the second area,
    a cross section of the first stacked structure and a cross section of the second stacked structure are different from each other, and
    the first opening corresponds to the second emission region of the pixel of the second group.

3. The display device of claim 2, further comprising:
    an organic pattern disposed on the display panel, overlapping the first area, and not overlapping the second area.

4. The display device of claim 3, wherein the thin encapsulation layer includes:
    a first encapsulation inorganic layer;
    an organic layer disposed on the first encapsulation inorganic layer; and
    a second encapsulation inorganic layer disposed on the organic layer.

5. The display device of claim 4, further comprising:
    at least one inorganic layer disposed between the second encapsulation inorganic layer and the organic pattern.

6. The display device of claim 3, wherein a thickness of the organic pattern is about 30,000 Å or less.

7. The display device of claim 3, wherein
    the at least one insulating layer includes:
        a first inorganic layer;
        a second inorganic layer disposed on the first inorganic layer; and
        an organic layer disposed on the second inorganic layer, and
    the organic pattern is disposed between the first inorganic layer and the second inorganic layer.

8. The display device of claim 2, wherein
    the display panel deactivates the pixel of the first group and activates the pixel of the second group in a first operation mode, and
    the display panel activates the pixel of the first group and the pixel of the second group in a second operation mode.

9. The display device of claim 2, wherein
    the pixel of the first group includes a first color pixel, a second color pixel, and a third color pixel that generate different lights from one another, and
    the pixel of the second group includes a first color pixel, a second color pixel, and a third color pixel that generate different lights from one another.

10. The display device of claim 9, wherein
    each of the first area and the second area includes a plurality of unit regions,
    the first color pixel, the second color pixel, and the third color pixel in the first group and the first color pixel, the second color pixel, and the third color pixel in the second group are disposed in corresponding ones of the plurality of unit regions, and
    the first color pixel, the second color pixel, and the third color pixel in the first group and the first color pixel, the second color pixel, and the third color pixel in the second group have a same arrangement.

11. The display device of claim 1, further comprising:
    a light blocking pattern disposed on the first organic layer, wherein
    a first light blocking opening corresponding to the first opening is disposed in the light blocking pattern.

12. The display device of claim 11, wherein a refractive index of the second organic layer is greater than a refractive index of the first organic layer.

13. The display device of claim 12, wherein the second organic layer overlaps the light blocking pattern.

14. The display device of claim 2, wherein
    the first organic layer includes an inclined surface defining the first opening, and
    the inclined surface and an upper surface of the at least one insulating layer exposed to the first opening meet at an obtuse angle.

15. The display device of claim 2, wherein
    the input sensor includes a conductive mesh line overlapping the peripheral region and defining a sensor opening corresponding to the emission region, and the conductive mesh line is disposed on the at least one insulating layer and overlaps the first organic layer.

16. The display device of claim 15, wherein
the at least one insulating layer includes a first inorganic layer and a second inorganic layer disposed on the first inorganic layer,
the conductive mesh line includes a first sensing electrode and sensing patterns insulated from the first sensing electrode,
the input sensor includes a bridge pattern which electrically connects the sensing patterns and overlaps the first sensing electrode, and
the bridge pattern is disposed between the first inorganic layer and the second inorganic layer.

17. The display device of claim 1, wherein the first organic layer spaced apart from the thin encapsulation layer by at least one insulating layer that is disposed between the first organic layer and the thin encapsulation layer.

18. The display device of claim 1, wherein
the first organic layer includes an organic material, and
the first opening does not include the organic material.

19. The display device of claim 2, wherein the pixel of the first group and the pixel of the second group have a same pixel arrangement.

20. A display device comprising:
a display panel including:
a base layer including a peripheral region and emission regions;
an organic light emitting element disposed on the base layer, and including:
a first electrode;
a light emitting pattern disposed on the first electrode; and
a second electrode disposed on the light emitting pattern; and
a thin encapsulation layer overlapping the organic light emitting element;
an input sensor disposed on the display panel; and
an optical control layer disposed on the input sensor, wherein
the input sensor includes:
an organic pattern disposed on the display panel;
a conductive mesh line disposed on the display panel and the organic pattern, the conductive mesh line defining a plurality of sensor openings corresponding to the emission regions; and
a first organic layer overlapping the conductive mesh line, and
the optical control layer includes a second organic layer overlapping the first organic layer, and having a higher refractive index than a refractive index of the first organic layer.

21. The display device of claim 20, further comprising:
at least one insulating layer disposed on the display panel.

22. The display device of claim 20, further comprising:
a light blocking pattern disposed on the first organic layer, the light blocking pattern including light blocking openings overlapping the emission regions.

* * * * *